United States Patent
Smeets et al.

(10) Patent No.: US 6,556,151 B1
(45) Date of Patent: Apr. 29, 2003

(54) METHOD AND APPARATUS FOR ENCODING AND DECODING INFORMATION SIGNALS

(75) Inventors: Bernard Jan Marie Smeets, Dalby (SE); Jan Åberg, Lund (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 08/997,771

(22) Filed: Dec. 24, 1997

(30) Foreign Application Priority Data

Dec. 30, 1996 (SE) ................................. 9604834

(51) Int. Cl.⁷ .......................... H03M 7/30; H03M 7/40
(52) U.S. Cl. .................................... 341/87; 341/65
(58) Field of Search ....................... 341/57, 63, 65, 341/67, 107; 235/437; 382/231; 359/185; 714/746; 375/240.11, 240.14, 240.23; 704/204, 230, 503; 707/204, 541

(56) References Cited

U.S. PATENT DOCUMENTS

| | | | |
|---|---|---|---|
| 3,651,459 A | * 3/1972 | Hahn | .................. 382/231 |
| 4,535,320 A | * 8/1985 | Weaver | .................. 341/65 |
| 4,546,342 A | * 10/1985 | Weaver et al. | .................. 341/51 |
| 5,062,152 A | 10/1991 | Faulkner | |
| 5,488,616 A | 1/1996 | Takishima et al. | |
| 6,373,412 B1 | * 4/2002 | Mitchell et al. | .................. 341/65 |

FOREIGN PATENT DOCUMENTS

| | | |
|---|---|---|
| EP | 0 582 907 A2 | 2/1994 |
| EP | 0 692 913 A2 | 1/1996 |

* cited by examiner

Primary Examiner—Patrick Wamsley
(74) Attorney, Agent, or Firm—Jenkens & Gilchrist, P.C.

(57) ABSTRACT

A method and apparatus for coding and decoding information are disclosed. The method is for encoding a message that includes a first set of binary digits. Each binary digit has a first value ("0") or a second value ("1"). The method includes receiving a first set of binary digits, generating a second set of binary digits in response to the first set of binary digits (Y), and selecting the values of binary digits in the second set such that the number of binary digits having the first binary value in the second set is higher than the number of binary digits having the first binary value in the first set.

51 Claims, 13 Drawing Sheets

| X | H |
|---|---|
| t | 0 0 0 |
| r | 0 0 1 |
| a | 0 1 0 |
| n | 1 0 0 |
| s | 0 1 1 |
| m | 1 1 0 |
| i | 1 0 1 |
| w | 1 1 1 |

FIG.3D

| 000 | 001 | 010 | 100 | 011 | 110 | 101 | 000 | 000 |
|---|---|---|---|---|---|---|---|---|
| t | r | a | n | s | m | i | t | t |

FIG.3E

METHOD AND APPARATUS FOR ENCODING AND DECODING INFORMATION SIGNALS

TECHNICAL FIELD OF THE INVENTION

The present invention relates to a method for encoding information, and a method for decoding information. The invention also relates to a device for encoding information and to a device for decoding information.

DESCRIPTION OF RELATED ART

In information processing it is sometimes desirable to transform a message, carrying the information, such that the symbols in the message are adapted to suit a particular purpose. The concept of transforming a message is often referred to as encoding or decoding. Electronic devices for handling information commonly comprises memory units for storing information and display units for displaying said information after retrieval from the memory unit. For the purpose of maximizing the amount of storable information in the memory unit, and/or for the purpose of reducing the size of the memory unit the information can be stored in a compressed state in the memory units.

U.S. Pat. No. 5,062,152 relates to a method of processing an analog signal having an amplitude range with a non-uniform probability density. The method includes quantizing the analog signal as falling within one of plural signal levels, and assigning a binary code word to the quantization levels in accordance with the occurrence probability of the quantization levels. According to the method described in U.S. Pat. No. 5,062,152 each code word is predetermined to include eight binary-valued digits.

U.S. Pat. No. 5,488,616 relates to an encoding method. According to U.S. Pat. No. 5,488,616 symbols are provided, each symbol having an occurrence probability. The first method step is to assign a variable-length-code-word to each symbol according to occurrence probability of each symbol. This step uses Huffman coding. Thereafter the variable-length-code-word is coded in two different fashions to provide a first code $C_{32}$ and a second code $C_{34}$. In a final step one or both of the codes $C_{32}$, $C_{34}$ are selected to provide a reversible variable length code.

SUMMARY

One problem which the invention addresses is to achieve a reduction in the amount of memory space required for storing a certain amount of information. More specifically an embodiment of the invention relates to the problem of achieving a compression of information in a manner which allows retrieval of the information by means of an information retrieval program which, in itself, requires a minimum of memory space.

The above mentioned problem is addressed by a method for reducing the number of binary digits in a message, the method comprising the steps of receiving at least one message comprising a plurality of characters; and encoding the message in accordance with a predefined Huffman coding method such that a compressed message is generated, the compressed message having a reduced number of binary digits. For the purpose of improving the compression effect the Huffman coding is preceded by the steps of calculating, for each character, a value indicating a relative frequency of the character in the at least one message; and assigning a first binary coded code symbol to a character having the highest relative frequency, the code symbol comprising a plurality of binary digits. If, for example, the received characters were coded as eight binary digit words, and there are no more than 64 different characters in the received message it will be sufficient to use a word length of six binary digits in the symbols.

All or substantially all the binary digits in the first binary coded code symbol are selected to a first binary value, for example all the binary digits may be set to zero.

A unique symbol is assigned to each unique remaining character so as to generate a first encoded message. The binary digits in each symbol are selected such that the number of digits having the first binary value is maximized in the first encoded message.

The first encoded message is further processed such that a second set of binary digits is generated, the further processing including the step of selecting the digits in the second set of digits such that the number of digits having the first binary value in the second set is higher than the number of digits having the first binary value in the first set.

According to a preferred embodiment, the further processing is adapted to generate the second set of digits sequentially such that the sequence of binary digits in the second set of digits resembles the output of a memoryless Bernoulli source. According to a further embodiment the further processing is adapted to generate the second set of digits such that the entropy of the sequence of binary digits in the second set of digits is near the entropy of a memoryless Bernoulli source; and such that the distribution of the sequence of binary digits in the second set of digits is substantially independent of the distribution of binary digits in the first encoded message.

A problem to which the present invention is directed is to provide a method for transforming a message in such a manner that the transformed message is suited for efficient compression.

The invention is also directed to the problem of encoding a message such that a minimum of band width, or a minimum of power, is required when transmitting the message, e.g. via a radio link.

An embodiment of the invention is directed to the problem of retrieving information, such as ASCII-coded texts, from an encoded message.

An embodiment of the invention is directed to the problem of encoding an analog signal such that a minimum of band width, or a minimum of power, is required for transmitting it, e.g. via a radio link.

An embodiment of the invention is directed to the problem of providing a device which is capable of displaying text messages in a plurality of languages while keeping the memory space requirements to a minimum.

The invention is also directed to the problem of providing a device for transforming information such that the transformed information is suited for efficient compression.

The invention is also directed to the problem of providing an information retrieval program which, in itself, requires a minimum of memory space. The purpose of the information retrieval program is to retrieve information, such as ASCII-coded texts, from a compressed message.

A preferred embodiment of the invention relates to coding a message such that the information content is represented by a minimum number of binary digits (bits). The preferred coding is achieved by three main steps:

In a first step each character of a received message is translated into Hamming symbols. This step results in a reduction of the number of binary digits with value one ("1") in the message. Additionally the number of binary digits required for representing the information is reduced.

In a second step the Hamming symbols are interpreted as a first bitstream Y, and the bitstream is subjected to an estimation process whereby a second bitstream E is generated. The estimation process results in a higher proportion of binary digits having value zero in the second bitstream E than in the first bitstream Y. Additionally the sequence of binary digits in the second bitstream E resembles the output of a memoryless Bernoulli source. Since the number of binary digits with value one ("1") is very low, and since the sequence of binary digits in the second bitstream E resembles the output of a memoryless Bernoulli source, the conditions for successful Huffman coding are optimized in the second bitstream E.

In a third step the second bitstream E is compressed by means of Huffman coding such that a compressed set C of binary digits is generated. This step results in a distinct reduction of the number of binary digits required for representing the information since the second bitstream E provides optimum conditions for Huffman coding.

BRIEF DESCRIPTION OF THE DRAWINGS

For simple understanding of the present invention, it will be described by means of examples and with reference to the accompanying drawings, of which:

FIG. 3D is an example of a transformation table for co-operation with the finite state machines according to FIG. 3A.

FIG. 3E is an example of a bitstream.

Appendix 1 shows computer program pseudo-code for the of transformation of a first set of binary digits Y into a second set of binary digits E.

Appendix 2 shows computer program pseudo-code for the of transformation of a bitstream E into a set Y of binary digits.

DETAILED DESCRIPTION OF EMBODIMENTS

A human language comprises certain number of words, and some of these words are more frequently used than others. Each word can be represented by a specific combination of characters, or sometimes by only one character. This means that some characters are more frequently used than others in any one particular language. In electronic devices, such as mobile telephones, there are stored a certain number of predetermined messages, each of which is to be displayed on a display unit of the mobile telephone in response to a certain event. Commonly these messages are stored in a read-only memory. In order to display a message the corresponding data is read from the memory and for each character the corresponding ASCII-code is delivered to the display unit, which in response thereto displays a combination of ASCII-codes constituting the selected message.

As stated above, some characters have a higher relative frequency than others in one particular human language or in one particular predetermined set of messages. The present invention relates to a method for reducing the number of binary digits necessary for representing information in a predetermined language and/or for reducing the number of binary digits necessary for representing a predetermined set of messages in any language.

A Method for Creating a Transformation Table

Figures 1A, 1B:
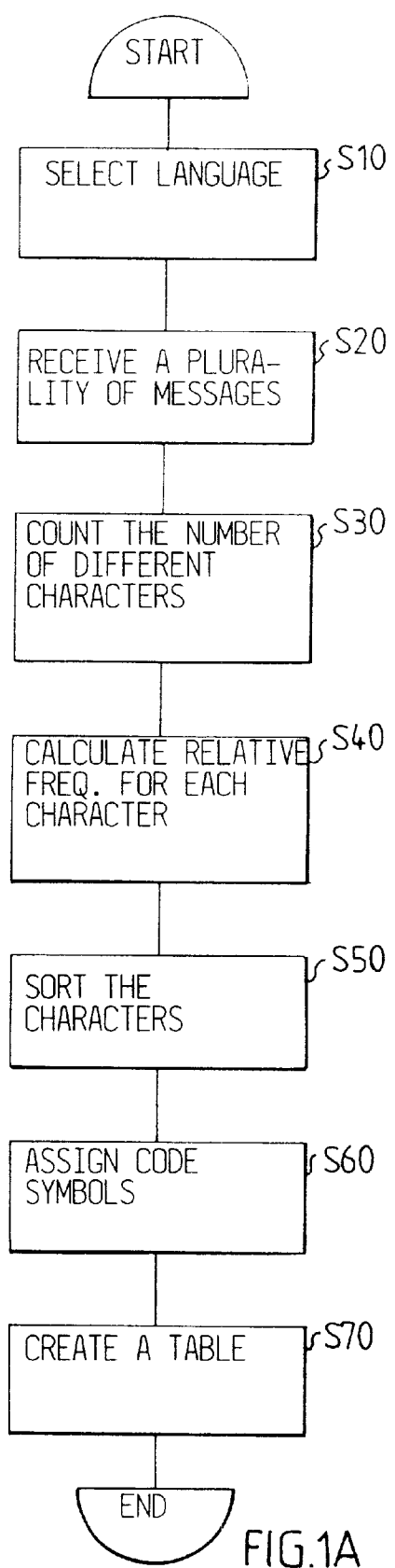
FIG. 1A is a flow chart illustrating a method for creating a table of correspondence between characters in a human language message and code symbols.
FIG. 1B is a representation of a transformation table.

FIG. 1A is a flow chart illustrating a method for obtaining a transformation table such that the character in a chosen set of messages, or the characters in a selected language, can be transformed into code symbols such that the total Hamming weight of messages of the selected type will be minimized.

A symbol may comprise one or a plurality of components. According to the preferred embodiment the each code symbol is a combination of binary digits.

The Hamming weight is minimized when the number of digits having value "1" is minimized. By transforming all the characters into corresponding Hamming symbols two important objects are achieved. The first object is that of assigning a weight to each character. As described below, a lower Hamming weight also leads to a larger compressibility of the symbol, thereby providing a link between the Hamming weight and the memory space required for storing the symbol. Secondly, the transformation into Hamming symbols in the manner described below reduces the weight difference between two consecutive characters in the message. In other words the number of digit positions which are different in a second symbol as compared to a first symbol is reduced.

With reference to FIG. 1A a first step S10 is to select a human language. The selected human language could be for example English, French, Swedish or any other human language which uses characters for composing messages. A variable is assigned the name of the selected language, and this language identifying variable is saved for identifying the table to be created.

In step S20 a complete set of messages is received. The number of characters in a complete set of messages could be for example 2500. According to one embodiment of the invention each character is composed of 8 binary digits.

In step S30 the number of mutually different characters are counted and a variable r is assigned the count value. In a typical alphabet the number of mutually different characters may be for example 64.

In step S40 the relative frequency for each character is calculated, and in step S50 the characters are sorted in order of decreasing relative frequency. In other words the most commonly used character is placed first in the list and the most infrequent character is placed last in the list. An example of such a list is shown in FIG. 1B. In FIG. 1B is shown a memory unit 10 having a plurality of memory positions 20. Each memory position may for example comprise 8 binary digits. The first memory position is provided with the language identifying variable, which may for example be the letter E identifying that the list/table comprises characters used in a set of English language messages. The second memory position in the list indicates the number of characters stored in this particular list. In this example the number of different characters is 64. The third memory position contains the ASCII-code for the character which has the highest relative frequency $p_1$. In this example the most frequent character is "H". In the fourth memory position is stored the character (in this example "G" having the second highest relative frequency $p_2$. In this manner the 64 different characters are placed in the list such that the character having the lowest relative frequency $p_{64}$ is placed in the last position in the list.

In step S60 a symbol having only zeros (0) is assigned to the character having the highest relative frequency $p_1$. In the example shown in FIG. 1B the selected set of messages contained only 64 different characters, and therefore the symbol to be assigned to the first character is a symbol comprising six digits, all of which are zero. According to the invention there is created a list of symbols, herein referred to as Hamming symbols, of increasing Hamming weight. The Hamming symbols are assigned to the characters in the list so that the character having the highest relative frequency $p_1$ is assigned a Hamming symbol having a lowest Hamming weight.

The character having the lowest relative frequency $p_{64}$ is assigned a Hamming symbol having a Hamming weight which is not lower than any of the other Hamming symbols. However, with the knowledge that the first Hamming symbol is a symbol with six digits, all of which are zero it is possible to calculate the subsequent Hamming symbol having a weight which is at most one weight step higher. According to the invention, therefore, it is not necessary to actually store a complete list of Hamming symbols. Instead it is sufficient to identify how many digits there are to be in the Hamming symbols. Since the number of digits required in the Hamming symbols can be calculated having knowledge of the number of characters, it is only necessary to have a predetermined manner of calculating subsequent Hamming symbols starting from a first Hamming symbol containing only zeros.

In step S70 a table of correspondence is created and the table is delivered to a memory unit for storage, as will be described below. Since none of the Hamming symbols actually needs to be stored, the list of correspondence only needs to include a variable indicating the name of the list, a figure indicating the number of characters in the list and the characters in order of decreasing relative frequency. Using this minimum amount of information it is possible to calculate the value of each Hamming symbol to be assigned to each character, which is the only information necessary for creating a table of correspondence. Accordingly, since it is only necessary to store a list of characters and a control word (the figure indicating the number of characters) a very small amount of memory space is needed for the table of correspondence.

A Method for Transforming a Message

Figure 2:
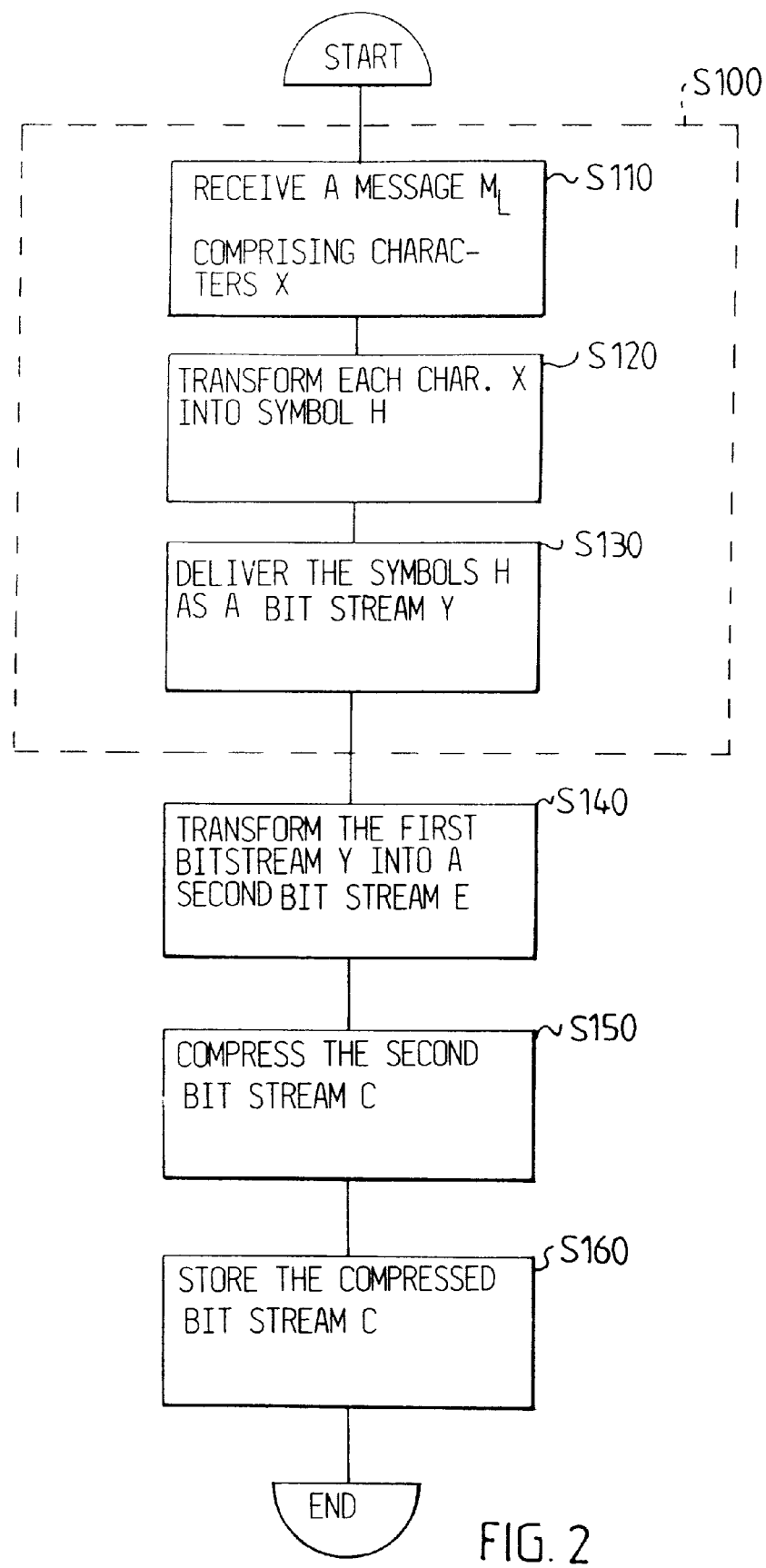
FIG. 2 is a flow chart illustrating a method for data compression according to one embodiment of the invention.

FIG. 2 is a flow chart illustrating a method for transforming a message into a bitstream, such that the bitstream has a minimal number of digits.

According to a first step S100 of an embodiment of the method, a message $M_L$ comprising a plurality of characters X is transformed into a bitstream Y. This is achieved by receiving the message $M_L$ (step S110), and transforming each character X into a corresponding symbol H, using a table as described above in connection with FIGS. 1B and 1A. According to step S120 consecutive characters in the message are consecutively transformed into symbols such that a stream of symbols H is provided. According to the next step S130 of the method the generated symbols H are delivered as a bitstream.

According to step S140 the bitstream Y is provided to an estimator for transforming the received bitstream into a second bitstream E. The purpose of step S140 is to provide a second bitstream E consisting mostly of zeros (0) in response to the bitstream produced by step S30. Another purpose of step S140 is to provide a second bitstream E whose digits are as close as possible to random variables which are independently and identically distributed. Step S140 is described in more detail with reference to FIG. 3 below.

According to step S150 the second bitstream produced in step S140 is compressed in accordance with a compression algorithm. According to one embodiment of the invention the compression algorithm used is Huffman coding. For detailed information about Huffman coding the reader is referred to D. A. Huffman. "A method for the construction of minimum redundancy codes." Proc. IRE, 40:1098–1101, 1952.

The compression step S150 generates a third bitstream C having fewer digits than the second bitstream. In fact the method as described above reduces a message $M_E$ in the English language to a mere 57.8% of the original number of binary digits. This figure was achieved for a full set of status messages for cellular phones, where the original messages in English required a size of 2323 bytes. The compression ratio of 0.578 includes the transformation table used for transforming the characters into corresponding Hamming symbols. This means that the actual compression ratio of the message, assuming the transformation table is available at the receiving end where the message is to be retrieved, is even better.

According to step S160 the third bitstream which is generated by step S150 is stored into a memory device. Alternatively the third bitstream provided by step S150 is delivered to an output for transmitting it to another electronic device.

According to the invention an advantageous compression ratio is achieved in the above manner. The above information transformation method is therefore suitable for transforming messages into compressed bitstreams before storing the message in a memory device, since the transformed message requires substantially less memory space than the original message. In the table below are provided examples of text messages in eleven different languages, and the corresponding compression ratio achieved when the message was compressed. The compression ratio is calculated as the size of the compressed message plus the size of the transformation table divided by the size of the original set of messages.

TABLE 1

| Language | Original size | Comp. ratio |
| --- | --- | --- |
| English | 2323 | 0.578 |
| German | 2638 | 0.571 |
| Portuguese | 2543 | 0.569 |
| Spanish | 2494 | 0.581 |

TABLE 1-continued

| Language | Original size | Comp. ratio |
|---|---|---|
| Italian | 2620 | 0.569 |
| Norwegian | 2376 | 0.576 |
| Dutch | 2665 | 0.571 |
| Danish | 2345 | 0.577 |
| Finnish | 2497 | 0.576 |
| French | 2557 | 0.582 |
| Swedish | 2471 | 0.589 |

It is clear from the above examples (see TABLE 1) that the compression ratio is nearly independent of the language used in the original message.

Figure 3A:
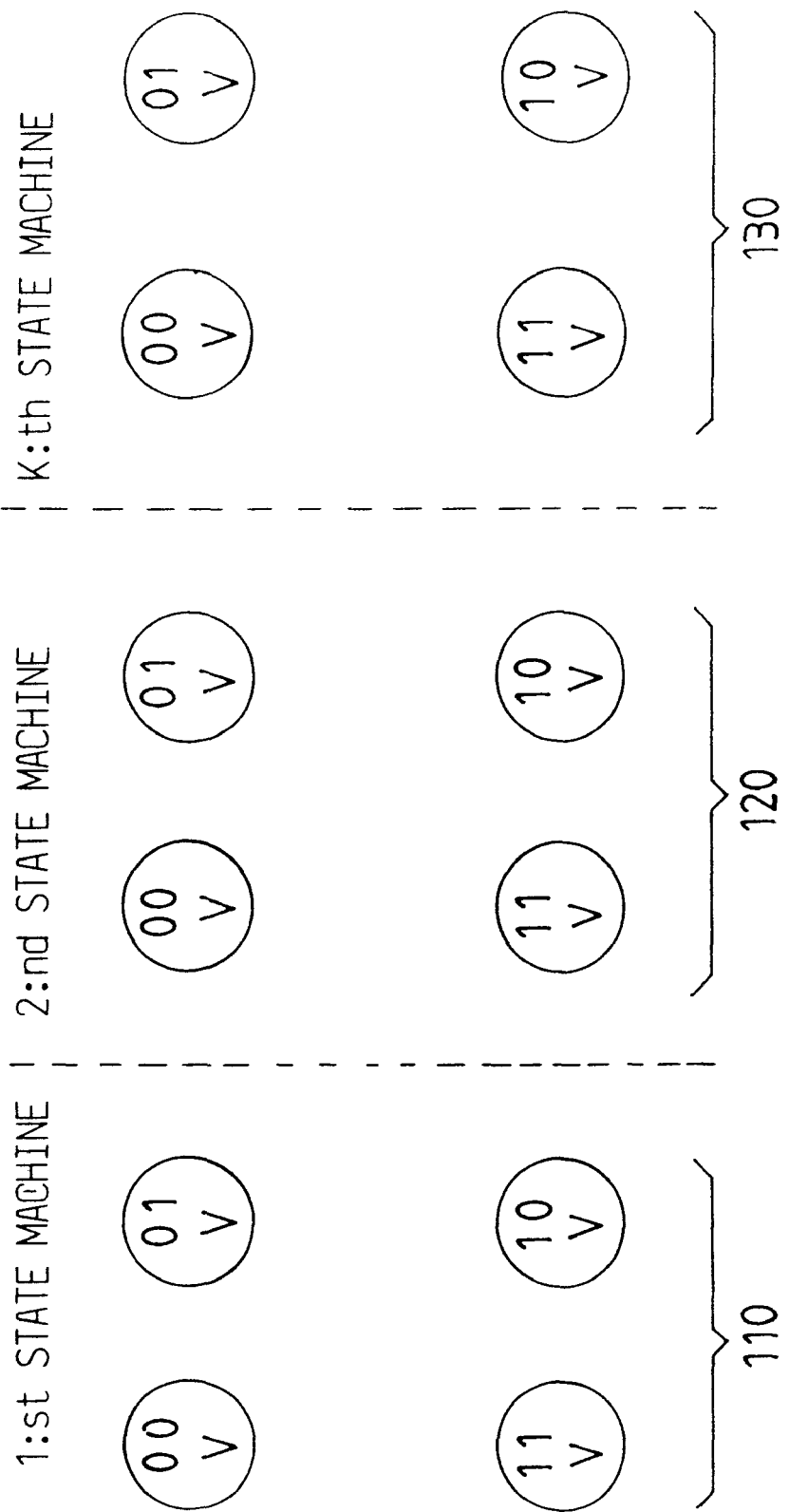
FIG. 3A illustrates a set of finite state machines, according to one embodiment of the invention.

Step S140 is described in more detail with reference to FIGS. 3A, 3B and 3C. Since the method described with reference to FIGS. 3B and 3C uses a set of finite state machines, an example of such a set of finite state machines is shown in FIG. 3A. For the purpose of executing the method according to step S140 in accordance with a preferred embodiment of the invention there is used a set of finite state machines having $k \cdot 2^m$ different states.

According to a preferred embodiment the parameters k and m are chosen as follows: k=6, and m=10. Parameter k is chosen to 6 because there are not more than $2^6$ characters in an alphabet usually used in the messages to be coded according to the preferred embodiment. The parameter m is selected sufficiently large to provide a sufficient "history" and small enough to avoid problems with poor statistics in each state. Another consideration for the choice of parameter m is to select it to a suitable value depending on the availability of memory for the counters producing the count values V, as described below with reference to FIGS. 5 and 3C.

For the purpose of illustrating the underlying principle of the method a set of finite state machines having only $3 \cdot 2^2$ states is shown in FIG. 3A. Thus the set of finite state machines shown in FIG. 3A is based on k=3 and m=2. The fact that m=2 means that each state is defined by two digits, as illustrated in FIG. 3A. The set of finite state machines in FIG. 3A consists of three different finite state machines 110, 120 and 130 since k equals 3. Each of the circles shown in FIG. 3A illustrates a state in the set of finite state machines 110, 120, 130, and according to the invention there is a count value V provided in each state in the set of finite state machines. In this manner the set of finite state machines according to FIG. 3A has a total of 12 different count values, each of which will be individually controlled in accordance with the method which will be described below.

In the following example, it is assumed that a set of messages has been analyzed, according to the method described in connection with FIG. 1A, such that a table of correspondence between characters X and symbols H in accordance with FIG. 3D has been established. In a real case the characters X would be shown in for example ASCII-codes, and the list of characters would be proceeded by a number indicating the number of characters in the list, but for sake of simplicity in this explanation the table of correspondence is shown as a direct table of correspondence between alphabetic characters and 3-digit Hamming codes. The list in FIG. 3D shows eight characters in order of decreasing relative frequency and corresponding Hamming symbols in order of increasing Hamming weight.

Figure 3B:
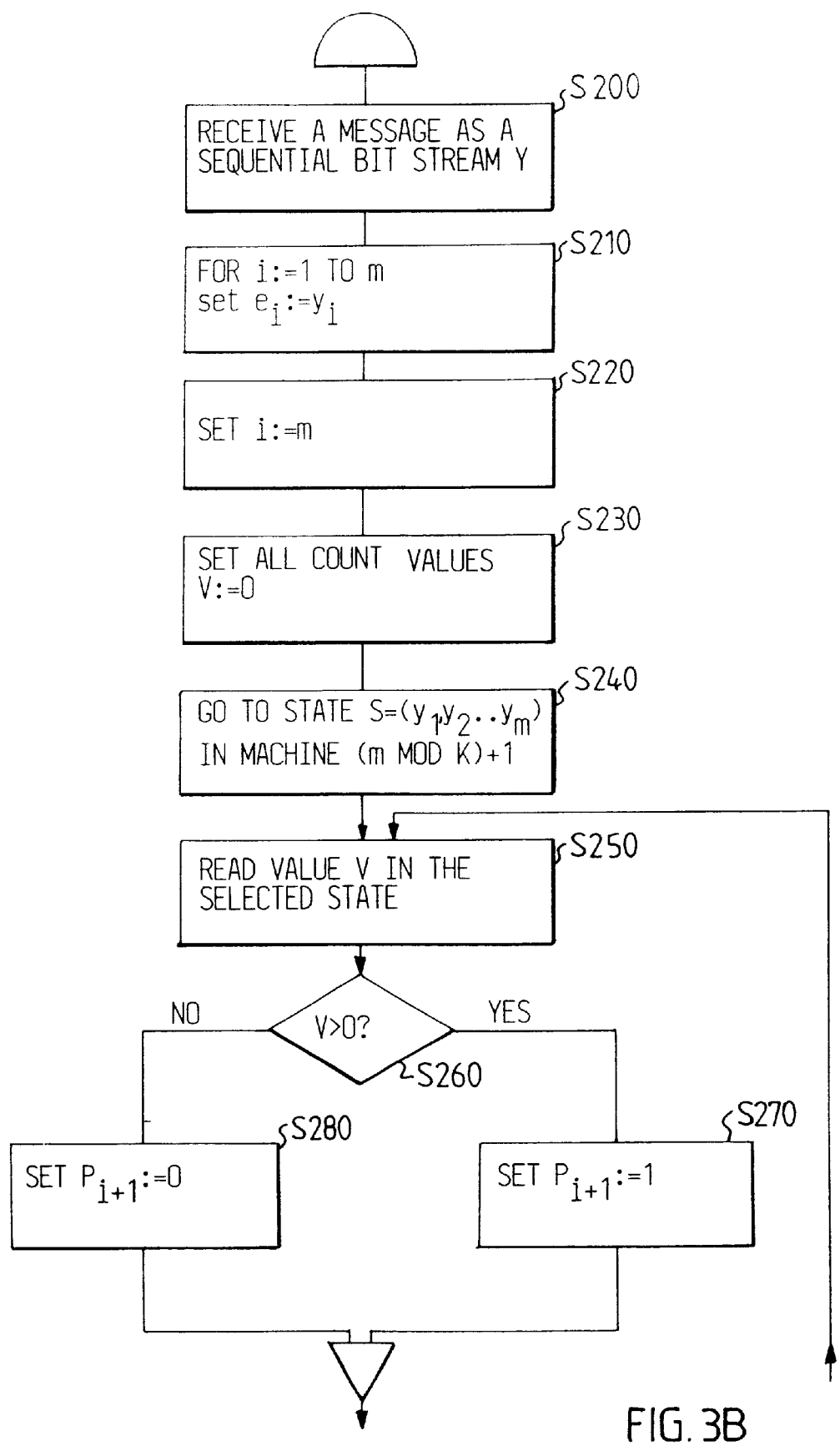
FIGS. 3B and 3C is a flow chart illustrating in detail one of the steps in the flow chart according to FIG. 2.
Figure 3C:
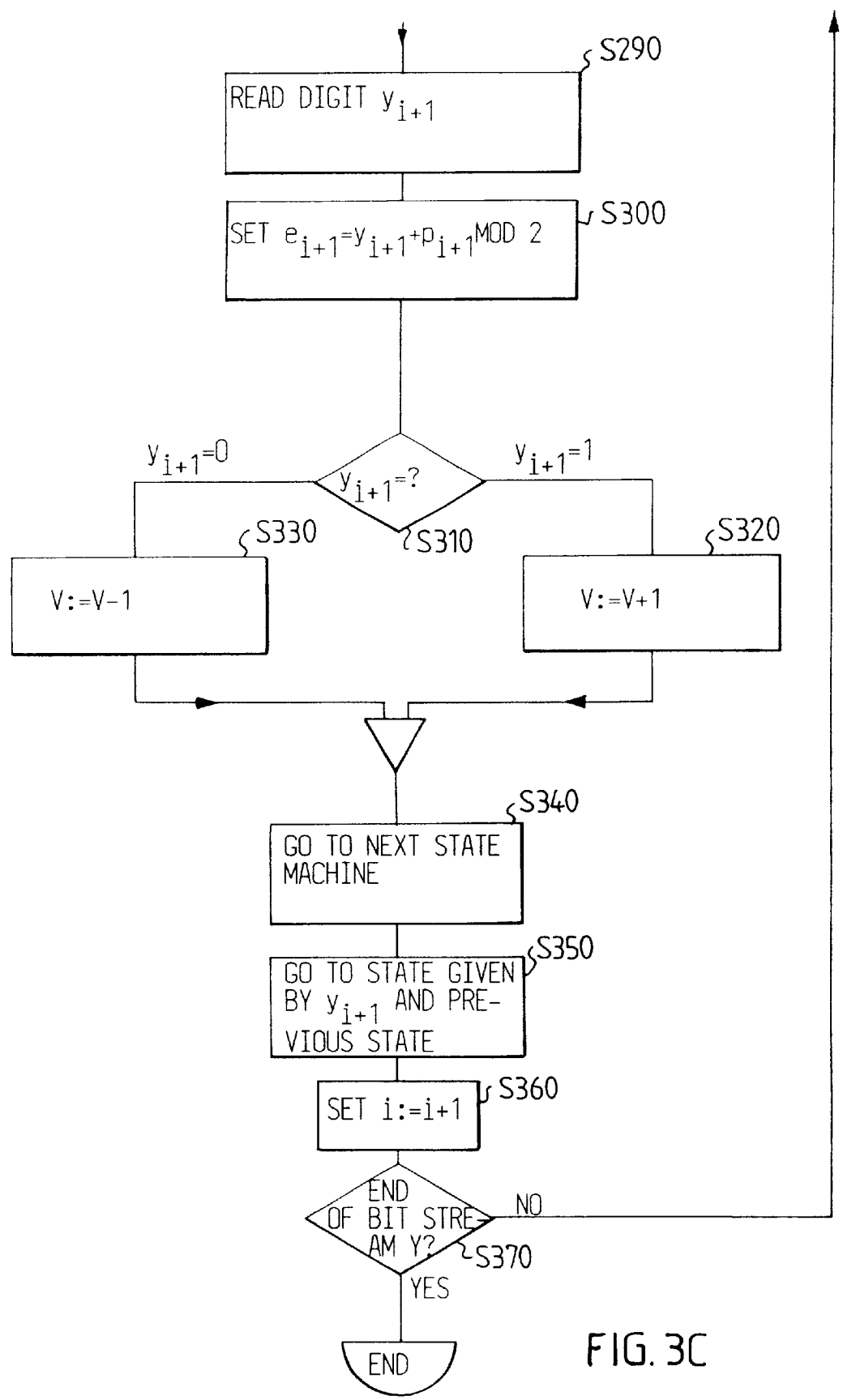

With reference to FIG. 3B step S200 indicates the method step of receiving a message in the form of a sequential bitstream $Y=y_1, y_2, y_3, \ldots y_n$ such as the bitstream shown in FIG. 3E. In the next step S210 the estimator produces output digits $e_i$, which for the first m digits equals the input digits $y_i$. In step S220 the value i is set to m.

In the following step S230 a number, k, of finite state machines are set up. In other words, a set of finite state machines comprising k different finite state machines are defined. Each finite state machine comprises $2^m$ states, and there is a count value V in each state. In step S230 all the count values V in the set of finite state machines are set to zero.

The finite state machines are ordered such that there are machines $M_1, M_2, \ldots M_j \ldots M_k$. With reference to step S240 in FIG. 3B the following procedure will start from finite state machine $M_j$, where j=(m mod k)+1. In the selected finite state machine, state $S=(y_1, y_2, \ldots y_m)$ is initially selected.

In the selected state, the value V is read (step S250), and thereafter (step S260) there is a check if the V>0. If V>0 a prediction value $p_{i+1}$, is set to one (1), as indicated by box S270 in FIG. 3B. If V<0 the prediction value $p_{i+1}$ is set to zero (0), as indicated by box S280 in FIG. 3B.

With reference to FIG. 3B and FIG. 3E the next input digit $y_{i+1}$ is read (step S290), and the output value $e_{i+1}$ is calculated, in step S300), by adding $y_{i+1}$ and $p_{i+1}$ modulo 2. Hence, 1+1 modulo 2 equals zero, 1+0 modulo 2 equals 1, and 0+1 modulo 2 equals 1.

Next, in step S310, there is a check of the value of digit $y_{i+1}$. If $y_{i+1}=1$ the count value V, in the selected state in the selected finite state machine, is increased by 1, i.e. V:=V+1, as illustrated in box S320 in FIG. 3C. If $y_{i+1}=0$ the count value V, in the selected state in the selected finite state machine, is decreased by 1, i.e. V:=V−1, as illustrated in box S330 in FIG. 3C.

Thereafter, in step S340, the next finite state machine $M_{j+1}$ is selected.

In the selected finite state machine: the state indicated by the value of digit $y_{i+1}$ and the previous state (Step S350) is selected. This is done in the manner commonly used for changing from one state to another state within one finite state machine. For example, with reference to FIG. 3A, when starting from state "00" in the first finite state machine 110 and the digit $y_{i+1}$ is a "1" state "01" is selected in the second finite state machine 120, in accordance with the invention. When the current state is state "01" in the second finite state machine 120 and the digit $y_{i+1}$ is a "1" there will be a transition to state "11" in the third finite state machine 130. If the current finite state machine is the last (k:th) finite state machine then there will be a transition to a state in the first finite state machine in the same manner.

Thereafter the index value i is increased by one, as indicated by box S360. Thereafter there is a control if any further binary digits remain in the received bitstream Y, as indicated by step S370 in FIG. 3C, and if the answer is "yes" we proceed again with step S250, reading the count value V in the selected state of the selected finite state machine. If, on the other hand, this was the last binary digit in the message the procedure is ended.

A Data Compression Device

Figure 4:
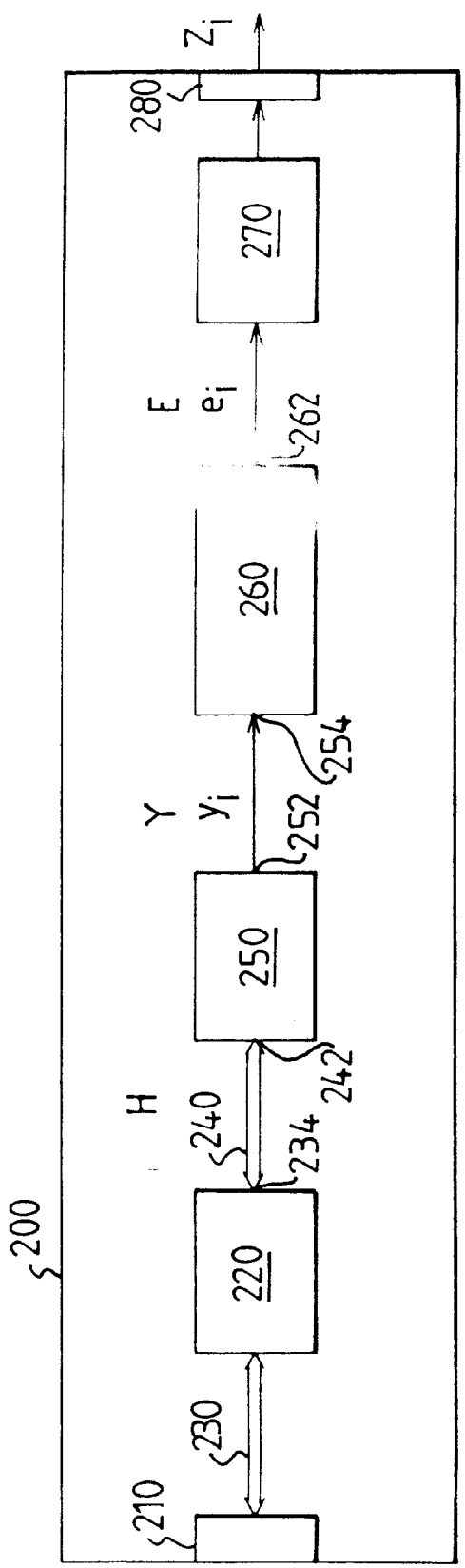
FIG. 4 shows a schematic block diagram of a first embodiment of a data compression device according to one embodiment of the invention.

With reference to FIG. 4 there is shown a block diagram of a first embodiment of a data compression device 200. The data compression device comprises a character input 210 for receiving characters of a message to be transformed. The character input 210 is coupled to a conversion unit 220 by means of a data bus 230. The data bus is capable of transferring eight digit characters in parallel, in accordance to one embodiment of the invention. According to another embodiment of the invention the digits in the received characters are delivered in series to the conversion unit 220.

Also, a character to be received at the character input 210 may comprise another number of digits. The conversion unit is set up to convert the received characters into symbols having a low Hamming weight, in the manner described above with reference to steps S110 and S120 in FIG. 2. The resulting symbol, which may comprise a lower number of digits than the corresponding character, is delivered from output 234 via a bus 240 to the input 242 of a symbol-to-bitstream converter 250. The symbol-to-bitstream converter 250 delivers, on its output 252 a bitstream with digits $y_i$ to an input 254 of an estimator unit 260. The purpose of the estimator unit 260 is to further reduce the number of digits having the value "1" in the bitstream, while maintaining the information content in the message. The estimator unit 260 produces a bitstream $E=e_1-e_n$ in response to reception of a bitstream $Y=y_1-y_n$, where n is the number of digits in the bitstream provided to the estimator unit 260. The bitstream E is delivered on an output 262 of the estimator unit 260. The bitstream E is delivered to a compression module 270 which is set up to reduce the number of digits in the bitstream while maintaining the information content in the message. The compression module operates in accordance with a compression algorithm, such as for example Huffman coding. According to a preferred embodiment a static Huffman code is used. Hence the compression module 270 produces a bitstream $C=c_1-c_r$, where r<n. The compressed bitstream C is delivered to a bitstream output 280, which may be coupled to a memory unit such that the compressed bitstream is stored in the memory unit. Alternatively the bitstream output 280 is coupled to a transmitter unit such that the compressed bitstream C is transmitted to another electronic unit. The reduction of the number of binary digits in the message leads to a lower requirement of bandwidth for the transmission channel, thereby increasing the efficiency of transmissions.

Figure 5:
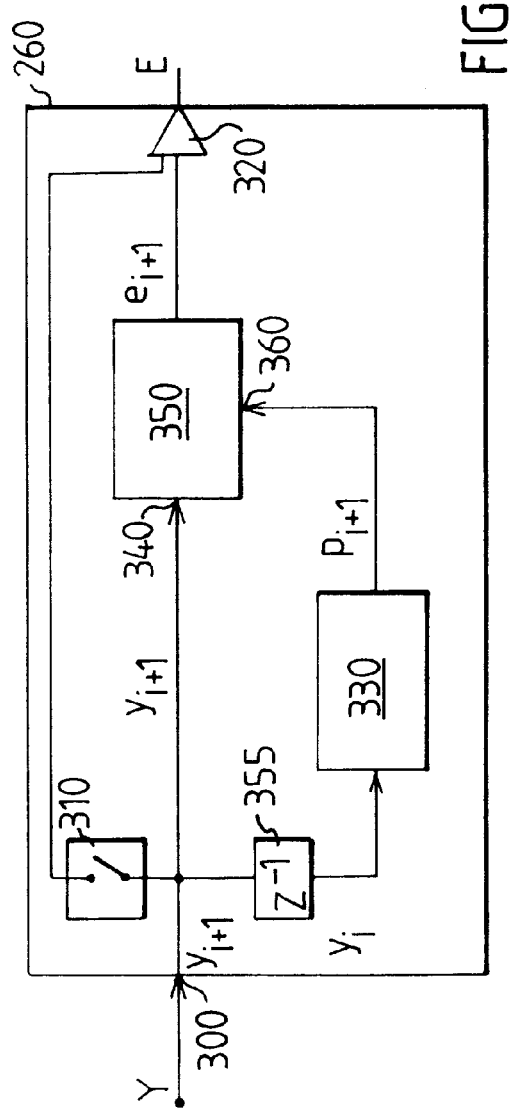
FIG. 5 is a schematic block diagram of an estimator for use in a data compression device according to FIG. 4.

With reference to FIG. 5 the estimator unit 260 is described in more detail. The estimator unit 260 has a series input 300 for receiving the bitstream Y comprising the binary digits $y_i$. The received binary digits $y_i$ are delivered to a switch unit 310 which is set up to switch the first m digits directly to an output 320. The bitstream input 300 is also coupled to a first input 340 of a modulo 2 adder 350 and, via a delay unit 355, to a predictor unit 330. The delay unit 355 remembers one binary digit such that it delivers binary digit $y_i$ when receiving binary digit $y_{i+1}$. The predictor unit 330 has an output which is coupled to a second input 360 of the adder 350. The adder 350 has an output which is coupled to the estimator unit output 320. The estimator 260 is thus set up to perform the method described above with reference to FIGS. 3B and 3C.

In the above described manner the predictor unit 330 is set up to make a prediction $p_{i+1}$ of the value of the next binary digit $y_{i+1}$. In other words the predictor unit 330 is set up to "guess" what value the binary digit $y_{i+1}$ has, basing the "guess" $p_{i+1}$ on the historical values $y_h$ for h<i+1. The "history" is provided by means of the count values in the finite state machines (see S260–S280 in FIG. 3B). From FIG. 5 it is readily understood that the result $e_{i+1}$ of the modulo 2 addition is zero (0) if the prediction is correct.

The value $e_{i+1}$ represents the Hamming distance between the predicted binary digit value $p_{i+1}$ and the actual binary digit value $y_{i+1}$. Thus the Hamming distance $e_{i+1}$ between two successive binary digits is zero (0) if the predictor makes correct predictions. It is clear from the above, with reference to table 1, that the method according to the invention achieves very favorable compression ratios. One of the causes for this advantageous result is accurate predictions $p_{i+1}$ in accordance with the described prediction method.

As described below, with reference to FIG. 9, the decoding method is based on doing the same type of prediction, using the already decoded binary digit values $y_i$ as "history" for achieving a value $p_{i+1}$ representing a prediction of the next Hamming distance $e_{i+1}$. Since the predictive decoding method uses the same type of prediction as the predictive coding does, the result of the decoding will be the correct binary digit stream Y.

An Electronic Data Processing Device

Figure 6:
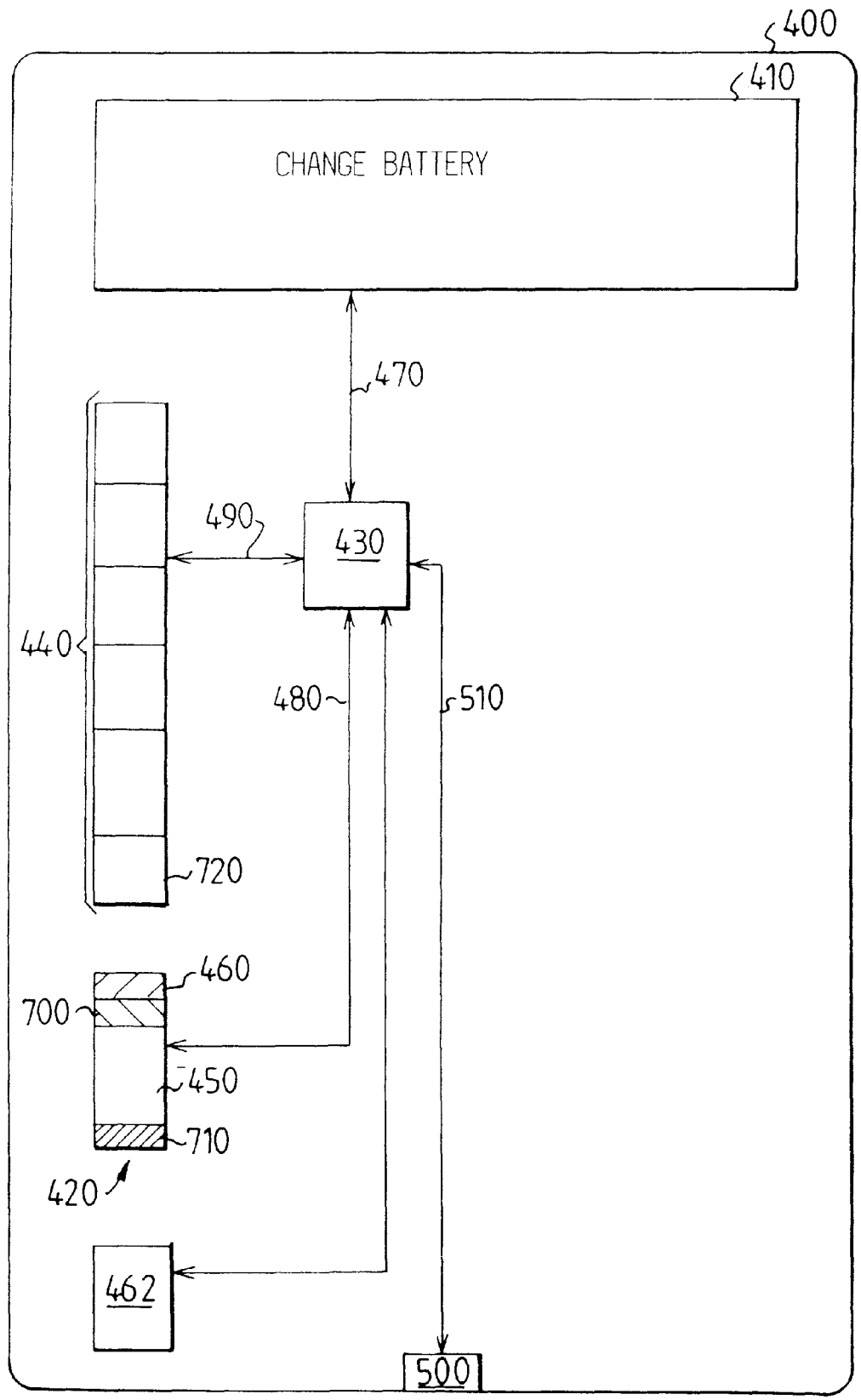
FIG. 6 is a schematic block diagram of a portable electronic device comprising means for restoring information which has been compressed and stored according to the method described in relation to FIG. 2.

With reference to FIG. 6 there is shown a data processing device 400 comprising a display unit 410 for the display of information such as text messages. The data processing device 400 comprises a non volatile memory 420, a microprocessor 430 and a read/write memory 440. The memory 420 has a first memory portion 450 wherein a computer program is stored for controlling the normal functions of the data processing device 400. The data processing device may be for example a portable electronic device such as a mobile telephone. The memory 420 also has a second memory portion 460, where a program for coding and/or decoding messages is stored. In another embodiment the program for coding and/or decoding messages is stored on a separate non-volatile recording medium 462. The program may be stored in an executable manner or in a compressed state.

When, in the following, it is described that the microprocessor 430 performs a certain function this is to be understood that the microprocessor performs a certain part of the program which is stored in the memory 450 or a certain part of the program which is stored on the recording medium 462.

The microprocessor 430 is coupled to the display unit 410 via a data bus 470. A user of the data processing device is provided with information messages by means of characters being displayed on the display 410. A particular message may be displayed in response to a certain event, such as for example the microprocessor having determined that the battery voltage in the electronic device is lower than a certain value, which prompts the microprocessor to display the message "CHANGE BATTERY".

The microprocessor 430 is coupled to the memory 420 by means of a data bus 480, and to the read/write memory 440 by means of a data bus 490. The microprocessor 430 also communicates with a data port 500 by means of a data bus 510.

The methods described with reference to FIGS. 1A, 1B, 2, 3A–3D can be performed by the microprocessor 430 by means of the microprocessor performing the program stored in the memory portion 460. In response to an instruction to create a table of correspondence, in accordance to the method described with reference to FIG. 1A, the microprocessor is set up to wait for reception of a message on the data port 500 and as the message is received on the data port 500 the characters are temporarily stored in the read/write memory 440. When all the characters of the received message, or of the received set of messages, have been temporarily stored, the microprocessor is set up to count the number of different characters and to calculate the relative frequency for each character. Thereafter the microprocessor 430 is set up to assign code symbols to the different characters in the manner described above, such that a table of correspondence is created.

Alternatively the microprocessor is set up to receive a ready made table of correspondence via the data port 500 and to store that table of correspondence in the read/write memory 440. As described with reference to FIG. 1B the table of correspondence may be limited to a list starting with a number, and followed by the same number of characters.

Thereafter the microprocessor may respond to an instruction for transforming the received message, or the received set of messages, into a reduced digit bitstream E, in accordance with the method described above with reference to FIG. 3B. When the message, or the set of messages, have been transformed into a bitstream this bitstream is stored in the memory 440. The microprocessor may of course be set up to store the bitstream E binary digit by binary digit or sorted in for example eight binary digit words, depending on the most efficient way of operating the memory which is used, or depending on other hardware considerations.

Appendix 1 shows computer program pseudo-code for the of transformation of a message set Y into a bitstream E. The pseudo-code corresponds to step S140 in FIG. 2 and the method described in FIGS. 3B and 3C.

A Data Restoring Device

Figure 7:
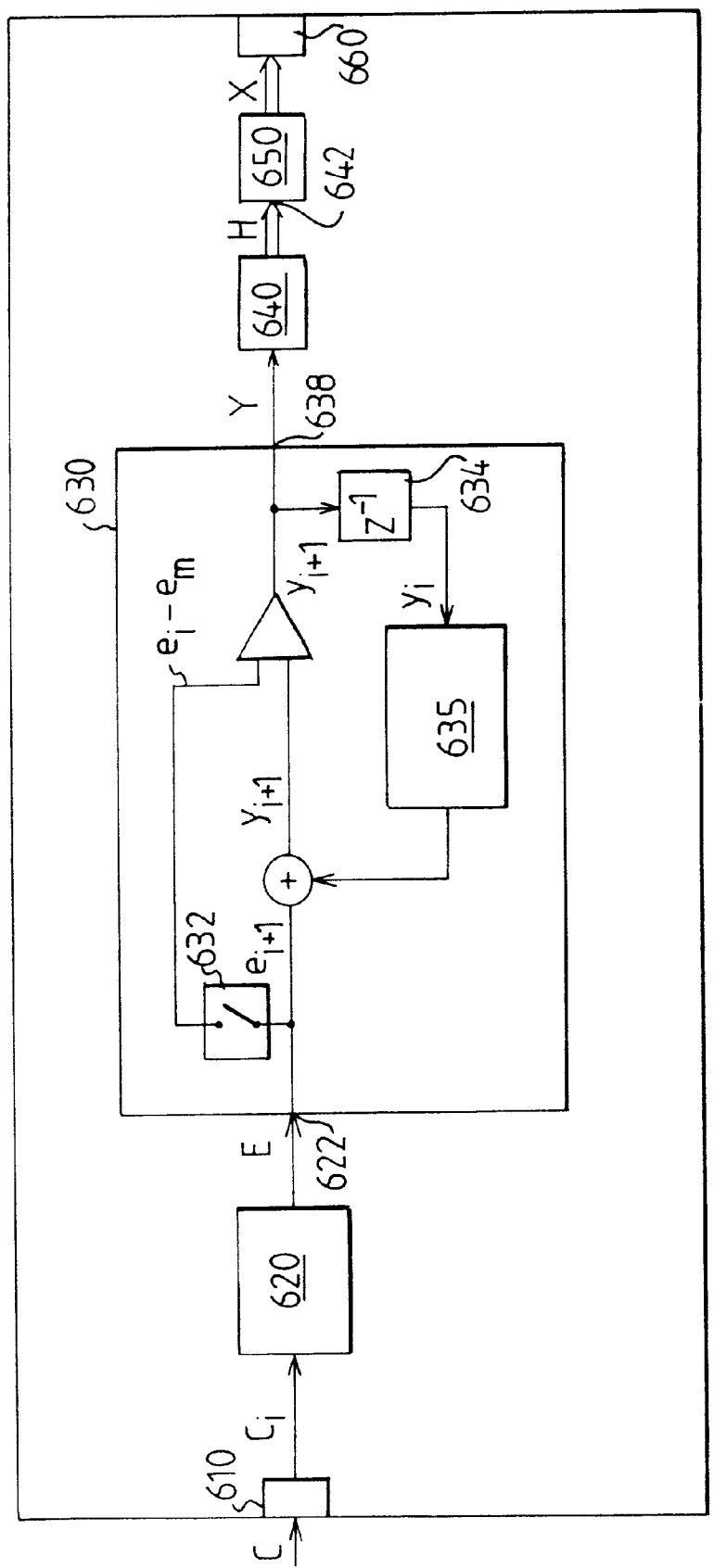
FIG. 7 shows a data restoring device according to one embodiment of the invention.

With reference to FIG. 7 a block diagram of a first embodiment of a data restoring device 600 is described. The data restoring device comprises an input 610 for receiving a compressed bitstream C consisting of a number of digits $c_i$. The input 610 is coupled to a decompression module 620, which is arranged to expand the bitstream C into a longer bitstream E while maintaining the information content. The decompression module 620 may be set up to perform decoding in accordance with a static Huffman code.

The decompression module 620 delivers the expanded bitstream E to an input 622 of a transformation unit 630 which is set up to perform substantially the reverse function of the estimator 260 which is described above. Hence the transformation unit 630 delivers a bitstream Y comprising a number of symbols H in series. For this purpose the estimator 260 includes a switch 632 functioning as switch 310 in FIG. 5. A delay unit 634 delivers binary digit $y_i$ on reception of binary digit $y_{i+1}$, in analogy with unit 355 in FIG. 5, and a predictor unit 635 generates prediction values $p_{i+1}$ in response to receiving the "historical" values $y_i$. Whereas the predictor unit 330 in the encoder 260 is coupled in a feed-forward fashion, the predictor 635 in the decoder 630 is coupled in a feed-back fashion such that the output Y is used as "historical" data for decoding the input binary digit string E.

The transformation unit 630 is set up to deliver the bitstream Y to an output 638. A converter 640 is coupled to the output 638 for converting the bitstream to symbols. The symbols H are delivered, via a data bus, to an input 642 of a conversion unit 650. The conversion unit 650 operates to convert the symbols H into characters X, such that the original message is restored. The characters X are delivered from the conversion unit 650 to an output 660. The characters delivered on the port 660 may be for example eight binary digit ASCII-codes.

A Method for Restoring a Message

Figure 8:
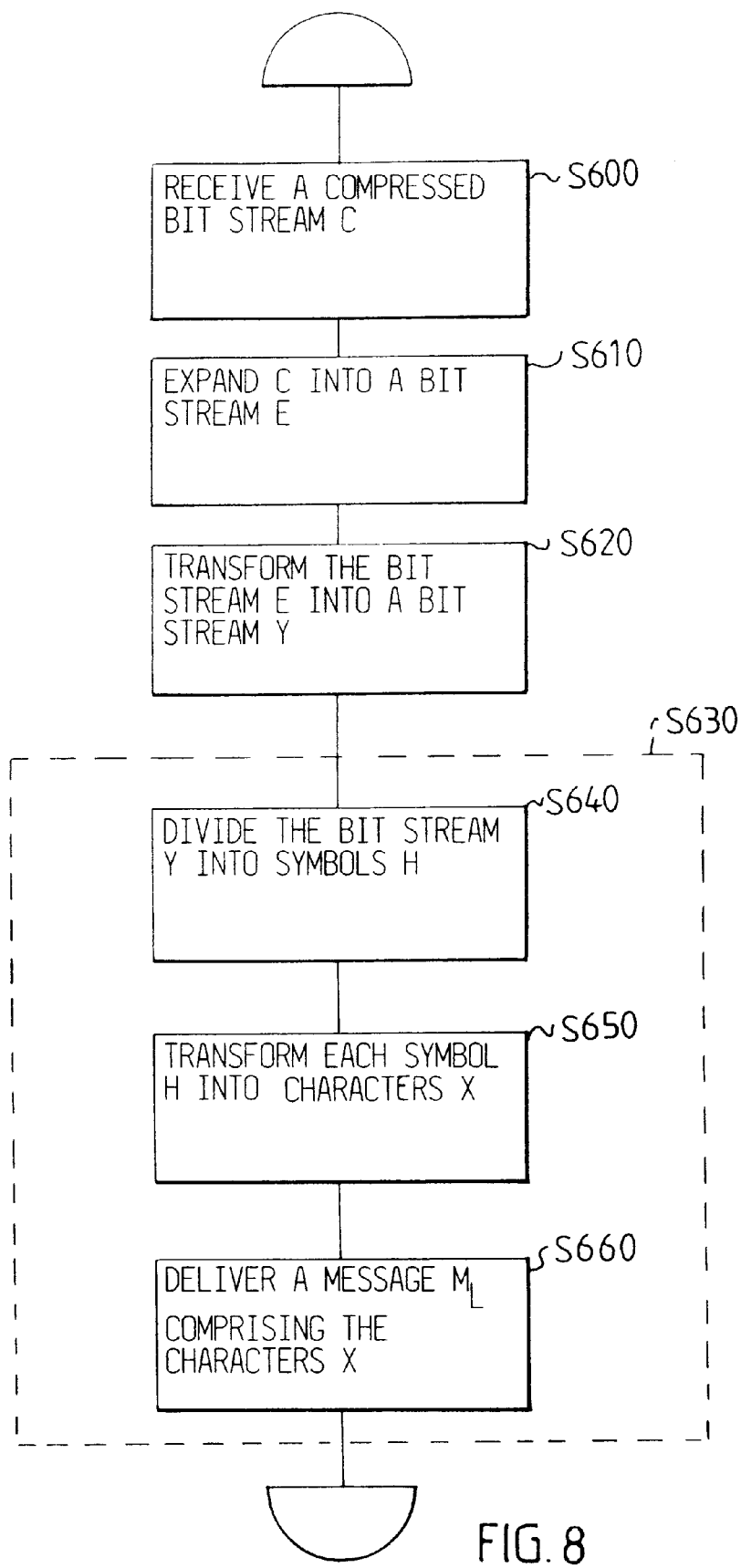
FIG. 8 is a flow chart illustrating a method for decoding according to an embodiment of the invention.

FIG. 8 is a flow chart illustrating a method for restoring a message M from a compressed bitstream C, in accordance with one embodiment of the invention. According to a first step S600 a compressed bitstream C is received. The bitstream C is expanded into a bitstream E (step S610) using a known method for decoding/expanding, such as Huffman decoding. The bitstream E is then transformed into a bitstream Y, essentially by performing the method described with reference to FIGS. 3B and 3C in reverse (S620).

Thereafter the bitstream Y is transformed into characters X such that the original message M is restored (step S630). This is achieved by dividing the bitstream Y into symbols H (S640), and thereafter transforming each symbol H into a corresponding character X (step S650). The transformation of symbols H into characters X is performed using a table of correspondence which was also included in the compressed bitstream C. Alternatively the transformation table is already provided and the compressed bitstream C includes only information to be transformed into a message. According to a third embodiment of the symbol-to-character transformation step, the compressed bitstream only comprises a number indicating the number of different characters in the message and a list of the characters. For the purpose of obtaining the transformation table a microprocessor, such as the microprocessor 430 (see FIG. 6) may be set up to calculate the symbols H corresponding to each character X in accordance with a predetermined algorithm which may be provided in the program stored in the memory portion 460 (FIG. 6).

When the symbols H have been transformed into characters X the resulting message is delivered.

With reference to FIG. 6 the compressed bitstream C may be provided in a memory portion 700 in the non volatile memory 420. In response to a message presentation instruction the microprocessor 430 may, using the program stored in the memory portion 450, use a standard expansion algorithm for decompressing a data restoring program which was stored in a program portion 710 of the memory 450. The program code stored in memory portion 710 is thus expanded and positioned in a memory portion 720 of the memory 440. As mentioned above the memory 440 may be a random access memory RAM. The microprocessor thereafter continues by executing the data restoring program from the memory portion 720. The execution of the data restoring program includes the step of reading the compressed bitstream C from the memory portion 700 in the non volatile memory 420 and thereafter executing the method steps S610, S620, S640 and S650 such that the compressed bitstream C is transformed into a stream of characters X constituting a message M. The message M, or parts of the message, are delivered by the microprocessor 430 to the display unit 410 via the data bus 470. Alternatively, depending on the circumstances, the message M may be delivered to the data port 500 via the data bus 510.

Figure 9A:
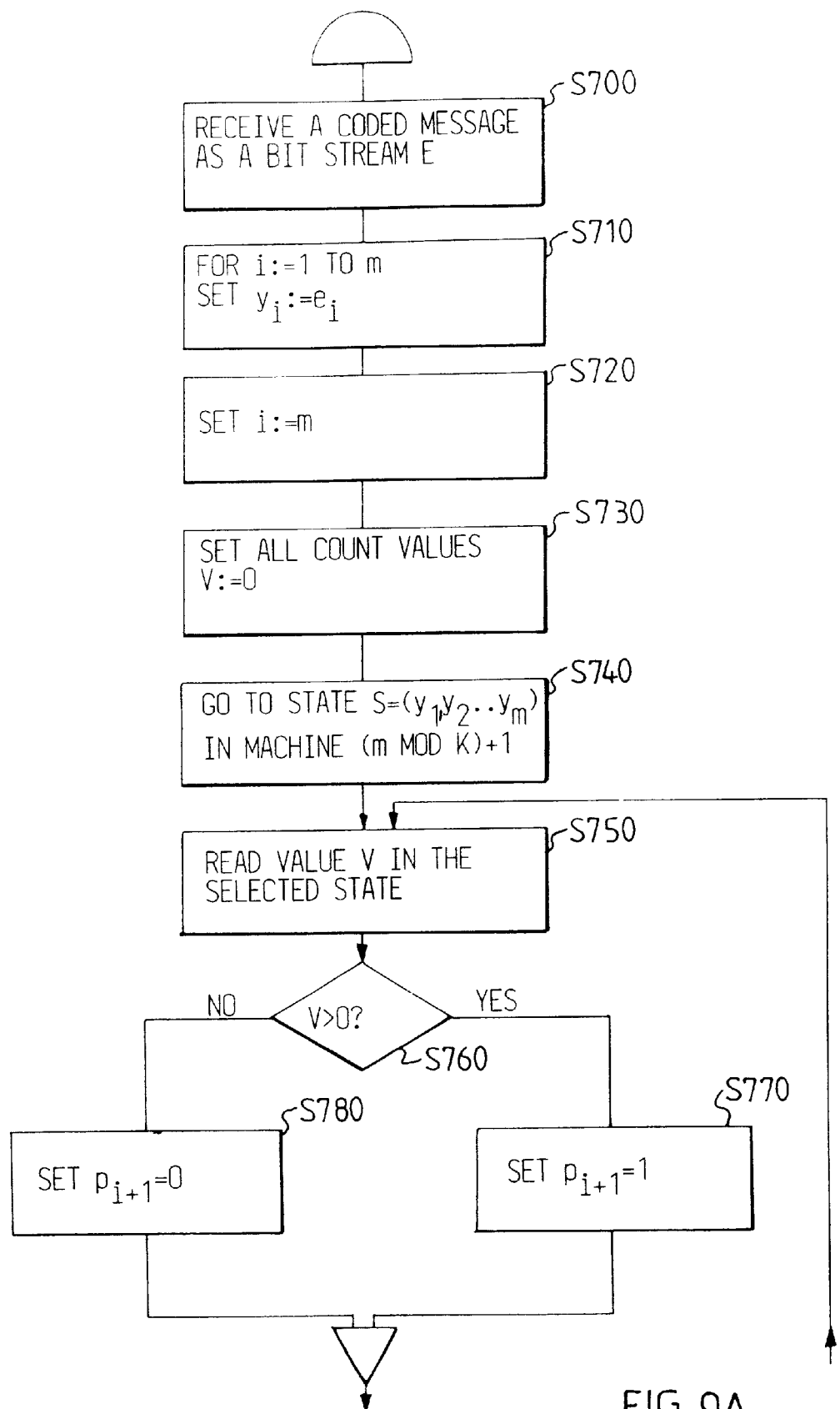
FIGS. 9A and 9B is a flow chart illustrating in detail one of the steps in the flow chart according to FIG. 8.
Figure 9B:
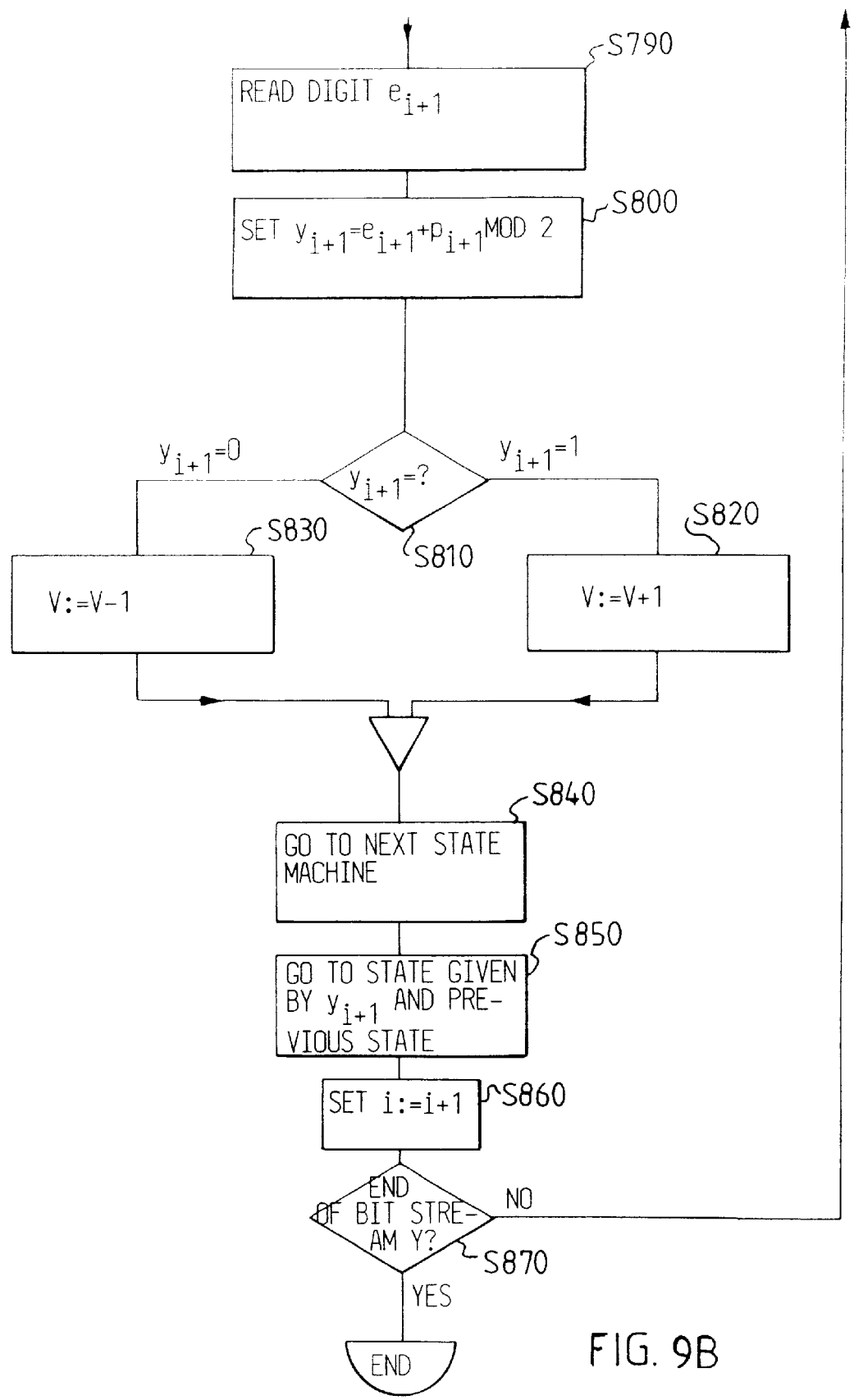

With reference to FIGS. 9A and 9B there is described in detail how the transformation of bitstream E into a bitstream Y (S620 in FIG. 8) is performed. The method described with reference to FIGS. 9A and 9B is herein referred to as a predictive decoding method, and the method described above with reference to FIGS. 3B and 3C is herein referred to as a predictive encoding method. The predictive decoding is performed essentially in the same manner as the predictive encoding, as is clear by comparing the flow chart according to FIG. 9 with the flow chart according to FIGS. 3B and 3C. Thus the method steps S700 to S870 essentially correspond to the method steps S200 to S370 described above. The difference between the decoding and the encoding is essentially that whereas in the encoding method digit $y_{i+1}$ is read from the input (S290) and the digit $e_{i+1}$ is calculated, the opposite is true in the decoding method. With reference to FIG. 9B the input digit $e_{i+1}$ is read and the output digit $y_{i+1}$ is calculated. Hence in step S810 in the decoding method the question about the value $y_{i+1}$ relates to the question of whether the output digit equals one or zero, whereas in the encoding method step S310 relates to the question of the value of the input value $y_{i+1}$.

Appendix 2 shows computer program pseudo-code for the of transformation of a bitstream E into a set Y of binary digits. The pseudo-code corresponds to step S620 in FIG. 8 i.e., the method described with reference to FIGS. 9A and 9B.

With reference to FIG. 6 the data restoring program in the memory portion 710 can be limited to a program routine defining the difference between the encoding and the decoding method. Thus there is a very small difference in the use of memory space between on the one hand storing only the decoding program in the memory and on the other hand storing the decoding program as well as the encoding program. Furthermore the skilled reader will realize that the above described coding methods and decoding methods require so advantageously few and mathematically uncomplicated steps that the program in itself will require an advantageously small amount of memory space. Hence a computer program for decoding and/or for encoding messages according to the invention is particularly advantageous in portable electronic devices where the use of memory space for program code directly translates into the size of the device. In mobile telephones, for example, a large number of messages need to be stored in the memory, and each telephone shall preferably be settable to produce the messages in a human language selected by the user. It is therefore an object of the present invention to provide a large number of such message sets in a small amount of memory space m a non volatile memory in the mobile telephone. Since the decoding program according to the invention requires such a small amount of memory space all the different language messages may be stored in a coded state, and when the user has selected the language in which he/she wants to see messages, the selected set of messages will be decoded in accordance with the above described method. A maximum amount of memory space is used during the execution of the predictive encoding and/or the predictive decoding program, since a number of count values V need to be temporarily stored during the execution of the program. Denoting the number of binary digits for each count value by c, the number of binary digits needed for storing the count values is $k \cdot 2^m \cdot c$. According to the preferred embodiment the value of c may be selected to equal 2 or 3.

In the above described embodiments the Hamming weight of the message is decreased for the purpose of providing an encoded message suitable for compression A suitable Huffman code provides a more efficient compression the lower the Hamming weight of the message to be compressed. However, by the choice of a different Huffman code a more efficient compression is achieved the higher the Hamming weight of the message to be compressed. Thus, according to, the invention, the transformation of characters into code symbols can be done in such a manner that the Hamming weight of the encoded message is maximized. In this case, the predictive encoding method is modified such that it strives to generate a bitstream E having a higher Hamming weight than the of the input bitstream Y.

A Communications Network

Figure 10:
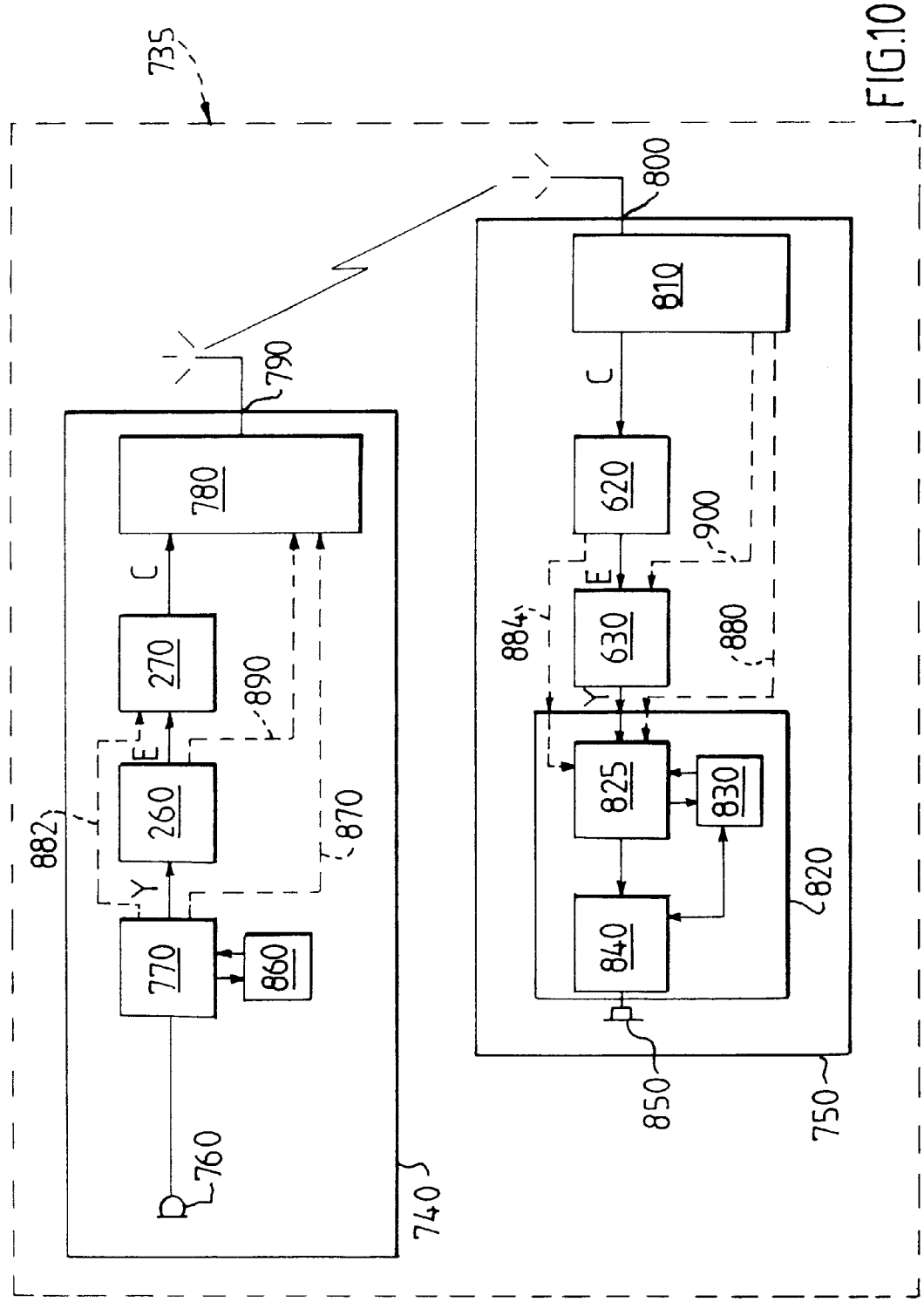
FIG. 10 is a schematic block diagram of a communications system including units for coding and decoding an analog signal.

FIG. 10 shows a communications network 735 including two units 740 and 750 communicating via a radio link. The unit 740 includes a microphone 760 for generating an analog signal, and a conversion unit 770 for quantizing the analog signal into a plurality of quantizing ranges and assigning codewords H to the quantizing ranges.

Hence, on receiving an analog signal the conversion unit 770 delivers a sequence of codewords H in the form of a bitstream Y. According to a preferred embodiment the bitstream Y is delivered to an estimator unit 260 of the type described in detail above. The output E of the estimator unit is delivered to a compression module 270, also operating as described above. The compressed bitstream C delivered by the compression module 270 is delivered to a transceiver 780. The transceiver 780 includes a communications port 790, e.g. an antenna, for communicating with the unit 750.

The unit 750 includes a communications port 800, e.g. an antenna, coupled to a transceiver 810 for receiving and delivering signals. The transceiver 810 is coupled to a decompression module 620 of the type described above, for translating a compressed bitstream C into a decompressed bitstream E. The decompressed bitstream E is delivered to a decoder 630 of the type described above in connection with FIG. 7. The output Y of the decoder 630 is delivered to a conversion unit 820.

The conversion unit 820 converts the received bitstream Y into an analog signal, which is delivered e.g. to a loudspeaker 850.

The conversion unit 820 includes a controller 825 and a memory 830 in which conversion information including a conversion table is stored. The memory 830 holds information about the word length of the codewords H. Using that information, the received bitstream Y is divided into codewords H by the controller 825.

The codewords H are subsequently delivered to a digital-to-analog (D/A) converter 840. The D/A converter 840 co-operates with the conversion table in the memory 830 to generate the signal levels defined by the codewords H. When the codewords H are fed to the D/A-converter 840 at the same frequency with which the original signal was sampled, the output of the D/A-converter will resemble the original analog signal.

The function of the conversion unit 770 is as follows: The conversion unit 770 receives an analog signal having an amplitude with a non-uniform probability density. The amplitude probability e.g. for speech has a maximum for zero amplitude, and decreases with increasing amplitude. Thus, after quantization of a speech signal the most probable quantization level ranges are those corresponding to the lowest amplitudes. For the purpose of minimizing the Hamming weight of the A/D-converted signal Y, the codewords H should be selected to minimize the number of binary digits having value "1" (one). A coding scheme for assigning codewords, with a minimum of zeros, to an analog signal is described in U.S. Pat. No. 5,062,152, the content of which is hereby incorporated by reference.

Advantageously, the digital signal Y delivered by the conversion unit 770 can be minimized by adapting the word length of the codeword H to the required number r of quantizing levels. If, for example, it is sufficient to have r=64 quantizing levels the code symbols need only include six binary digits. If the number of quantizing levels is between 65 and 128, a word length of seven (7) binary digits is required. The number r of quantizing levels definable by a word with d binary digits is:

$$r=2^d$$

The necessary number of binary digits d in the codeword H can therefore be established using the following equation:

$$d_1=ln(r)/ln2$$

If the result $d_1$ is not an integer the number of binary digits d are established by rounding $d_1$ up to the closest higher integer. If, for example, the required number of quantizing levels is r=190, the result $d_1$=ln(170)/ln2=7,409. Rounding $d_1$ to the closest higher integer renders d=8. Hence, the required number of binary digits in the codewords H is d=8. The word length d of the codewords H is transmitted to the unit 750 and stored in memory 830. The variable d is used by controller 825 for dividing the bitstream Y into codewords of the correct length upon reception of coded messages.

The required number of quantizing signal ranges depends on the maximum amplitude of the analog signal and of the amplitude resolution. For high fidelity reproduction of the analog signal the level ranges should be small so as to achieve a high amplitude resolution, hence a large number of quantizing signal levels should be used.

For the purpose of establishing a maximum amplitude of the analog signal the signal is measured for a certain time duration. The amplitude resolution can be set manually or automatically. By adapting the word length of the codewords to a historical maximum amplitude and a selected amplitude resolution the number of binary digits is minimized in the digital signal Y.

The conversion unit 770 generates a list of concordance between quantizing signal ranges and codewords, i.e. a conversion table. The list is stored in a memory 860 co-operating with the conversion unit 770. The list stored in a memory 860 is used for assigning code words H to quantizing signal ranges in accordance with the established concordance.

Additionally the list of concordance and the word length d is delivered from conversion unit 770 to the transceiver 780 for transmission to the unit 750. On reception of the list of concordance by transceiver 810, the list is delivered to conversion unit 820 for storage in the memory 830. The list stored in the memory 830 is thereafter used by the D/A converter 840 for generating the signal levels defined by the codewords H According to another embodiment of the communications network 735 the coded message, including the codewords H, is delivered directly from the conversion unit 770 to the transceiver 780, as indicated by dashed line 870 in FIG. 10.

In that embodiment the receiving unit 750 also provides a direct connection 880 between the conversion unit 820 and the transceiver 810.

According to yet another embodiment of the communications network 735 the coded message including the codewords H is delivered directly from the conversion unit 770 to the compression module 270. The direct connection is obtained by a data bus, indicated by dashed line 882 in FIG. 10. The unit 750 includes a corresponding data bus 884, providing a direct connection between the decompression module 620 and the conversion unit 820. The direct connection by data bus 884 enables a reduction of the number of binary digits in the encoded message delivered by conversion unit 770.

According to yet another embodiment there is a direct connection 890 between the estimator unit 260 and the transceiver 780 thereby allowing transmission of the bitstream E, which holds fewer zeros than the bitstream Y. Hence this embodiment has the advantage of further reducing the power required to transmit signals such as speech or music having non-uniform probability densities. The unit 750 includes a corresponding direct connection 900 between the transceiver 810 and the decoder 630.

The unit 740 may, of course, be adapted for receiving coded signals and decoding such signals as well. Hence, the unit 740 may include parts like the above described parts 620, 630, 820, 825, 830, 840 and 850. Likewise the unit 750 may be adapted to encode analog signals in the manner described above.

APPENDIX 1

```
void main(int argc, char * argv[ ])
{
ifstream *IF;        /* the message symbols (S200) */
ofstream *OF;
IF=new ifstream(*++argv,ios::in);
OF=new ofstream(*++argv,ios::out);
short bit;
int state=0;
int count[1024][6];   /* initialize counts for 6 state machines */
char m=1;             /* each with 2^10=1024 states        */
for (int i=0;i<1024,i++)   /*         (S230)    */
  for (int j=0;j<6;j++)
    count[i][j]=0;
int k=0;    /* holds the value of the currently used machine (0--5) */
int state=0; /* the state of the currently used machine     */
for (int i=0;i<10;i++)
    {
      bit=get_a_bit(IF);   /* put through first 10 bits     */
      put_a_bit(OF,bit);   /*        (S210–S220)   */
      state<<=1;           /* find the initial state       */
      state+=bit;          /* in the correct machine       */
      k=(k+1)%6;           /*        (S240)     */
    }
short bit=get_a_bit(IF);   /*        (S290)     */
while (bit>=0)    /* for each bit    (S370)       */
  {
    if (count[buf][k]>0)  /* find out if the bit should be inverted (S250–S260)*/
      put_a_bit(OF,~bit); /* invert bit                */
    else
      put_a_bit(OF,bit);  /* or don't invert bit       (S270, S280, S300) */
    if (bit)              /* update counters          (S310–330)   */
      count[buf][i]++;
    else
      count[buf][i]--;
    k=(k+1)%6;            /* move to next machine (S340)       */
    state<<=1;            /* compute the new state (S350)       */
    state&=statemask;
    i++;                  /* keep count of coded bits (S360)    */
    bit=get_a_bit(IF);    /*        (S290)     */
  }
}
```

APPENDIX 1-continued

```
  IF—>close( );
  OF—>close( );
};
void main(int argc, char *arg[ ])
{
ifstream *IF;         /* the bitstream (S700) */
ofstream *OF;
IF=new ifstream(*++argv,ios::in);
OF=new ofstream(*++argv,ios::out);
short bit;
int state=0;
int count[1024][6];   /* initialize counts for 6 state machines */
char m=1;             /* each with 2^10=1024 states         */
for (int i=0;i<1024,i++)   /*        (S730)       */
  for (int j=0;j<6;j++)
    count[i][j]=0;
int k=0;      /* holds the value of the currently used machine (0--5) */
int state=0;  /* the state of the currently used machine          */
for (int i=0;i<10,;i++)
  {
    bit=get_a_bit(IF);   /* put through first 10 bits    */
    put_a_bit(OF,bit);   /*       (S710–S720)           */
    state<<=1;           /* find the initial state       */
    state+=bit;          /* in the correct machine       */
    k=(k+1)%6;           /*       (S740)                 */
  }
short inbit=get_a_bit(IF); /*      (S790)         */
while (inbit>=0)     /* for each bit      (S870)    */
  {
    if (count[buf][k]>0)  /* find out if the bit should be inverted (S750–S760) */
      bit=~inbit;    /* invert bit          (S770–S870)    */
    else
      bit=inbit;     /* or don't invert bit  (S770–S780)   */
    put_a_bit(OF,bit);    /*       (S800)          */
    if (bit)              /* update counters   (S810–830)    */
      count[buf][i]++;
    else
      count[buf][i]--;
k=(k+1)%6;            /* move to next machine (S840)    */
state<<=1;            /* compute the new state (S850)   */
state+=bit;
state&=statemask;
    i++;              /* keep count of coded bits (S860)  */
    bit=get_a_bit(IF);    /*       (S790)          */
  }
  IF—>close( );
  OF—>close( );
};
```

What is claimed is:

1. A method for reducing the number of binary digits in a message, the method comprising the steps of:

encoding a message in accordance with a predefined Huffman coding method such that a compressed message is generated, the compressed message having a reduced number of the binary digits; the Huffman coding is performed after the following steps:

receiving at least one message comprising a plurality of characters;

calculating, for each character, a value indicating a relative frequency of the character in the at least one message;

assigning a first binary coded code symbol ($H_1$) to a character having the highest relative frequency, the code symbol comprising a plurality of binary digits;

selecting all or substantially all the binary digits in the first binary coded code symbol to a first binary value;

assigning a unique symbol to each unique remaining character so as to generate a first encoded message; the first encoded message consisting of a first set of binary digits; wherein the binary digits in each symbol are selected such that the number of binary digits having the first binary value is maximised in the first set of binary digits;

encoding the first set of binary digits such that a second set of binary digits is generated; and selecting the binary digits in the second set of binary digits such that the number of binary digits having the first binary value in the second set is higher than the number of binary digits having the first binary value in the first set.

2. The method according to claim 1, wherein the binary digit values in the second set of binary digits are generated sequentially using a sequential processing of the first set of binary digits.

3. The method according to claim 2, wherein the encoding of the first set of binary digits is adapted to generate the second set of binary digits such that the sequence of the binary digits in the second set of binary digits resembles the output of a memoryless Bernoulli source.

4. The method according to claim 3, wherein the encoding of the first set of binary digits is adapted to generate the second set of binary digits such that the entropy of the sequence of the binary digits in the second set of binary digits is near the entropy of a memoryless Bernoulli source having a parameter corresponding to the relative frequencies of the binary digit values in the second set; and the distribution of the sequence of the binary digits in the second set of binary digits is substantially independent of the distribution of the binary digits in the first encoded message.

5. In an information handling device, a method for encoding a message comprising a first set of binary digits, each binary digit having a first value or a second value, the method comprising the steps of:

receiving a first set of binary digits, wherein said first set of binary digits is generated by assigning a first binary coded symbol to a character having a highest relative frequency, said binary coded symbol comprising a plurality of binary digits;

generating a second set of binary digits in response to the first set of binary digits; and selecting the values of the binary digits in the second set such that the number of binary digits having the first binary value in the second set is higher than the number of binary digits having the first binary value in the first set.

6. The encoding method according to claim 5, wherein the encoding is such that the second set of binary digits includes the same number of binary digits as the first set of binary digits.

7. The encoding method according to claim 6, wherein the binary digit values are selected such that the distribution of a sequence of the binary digits in the second set of binary digits is substantially independent of the distribution of the binary digits in the first set of binary digits.

8. The encoding method according to claim 7, wherein the binary digit values are selected such that the entropy of a sequence of the binary digits in the second set of binary digits is near the entropy of a memoryless Bernoulli source.

9. The encoding method according to claim 8, wherein the encoding is such that the sequence of the binary digits in the second set of binary digits resembles the output of a memoryless Bernoulli source.

10. The encoding method according to claim 9, wherein the process of generating binary digits of the second set of binary digits includes setting the value of the m first binary digits of the second set equal to the value of the m first binary digits in the first set, where m is a positive integer;

generating a prediction value in response to a predefined number of previous binary digits in the first set of binary digits; said predefined number being a positive integer equal to, or lower than, m;

reading the value of an actual binary digit in the first set of binary digits, calculating the Hamming distance between the prediction value and value of the actual binary digit; and setting the value of the binary digit in the second set of binary digits equal to the calculated Hamming distance value.

11. The encoding method according to claim 10, wherein the process of generating the prediction value comprises the steps of:

establishing a plurality of predictor count values, each predictor count value being selectable dependent on binary digits in the first set of binary digits;

initially setting all the predictor count values to zero, selecting a combination of binary digits in the first set of binary digits;

f1) selecting the predictor count value in response to the selected combination of binary digits in the first set of binary digits, f2) reading the selected predictor count value;

f3) setting the prediction value to a first value if the selected predictor count value is higher than a predetermined value, and setting the prediction value to a second value if the selected predictor count value is lower than the predetermined value;

f4) increasing the selected predictor count value if the value of the actual binary digit in the first set of binary digits equals one, and decreasing the selected predictor count value if the value of the actual binary digit in the first set of binary digits equals zero;

f5) selecting a new combination of binary digits in the first set of binary digits; and repeating steps f1) to f5) until all binary digits in the first set of binary digits have been read.

12. The encoding method according to claim 11, wherein the process of calculating the Hamming distance between the predicted value and value of the actual binary digit comprises adding the predicted value and value of the actual binary digit modulo 2.

13. In an information handling device: a method for encoding a message, the message comprising a plurality of characters, the method comprising the steps of:

receiving a message;

assigning a binary coded code symbol to each character of the message such that the received message is translated into a first coded message, each code symbol comprising a plurality of binary digits, and each said binary digit having a first value or a second value;

interpreting the first coded message as a first set of binary digits;

encoding the first set of binary digits in the manner defined in claim 12.

14. The encoding method according to claim 13, wherein the transformation step is performed in accordance with a method comprising the steps of:

receiving at least one message comprising a plurality of characters;

calculating, for each character, a value indicating a relative frequency of the character in the at least one message; and assigning a first binary coded code symbol to a character having the highest relative frequency, the code symbol comprising a plurality of binary digits such that all or substantially all the binary digits in the first binary coded code symbol are of a first binary value.

15. The encoding method according to claim 14, comprising the steps of:

creating a list of characters, and storing the list such that the characters are retrievable substantially in order of decreasing, or increasing, occurrence probability.

16. The method according to claim 15, further comprising compressing the encoded message.

17. The method according to claim 15, further comprising encoding the second set of binary digits in accordance with Huffman coding.

18. The encoding method according to claim 14, wherein each symbol is generated such that the sum of the Hamming weights for all the symbols in the encoded message is minimized or maximised.

19. The encoding method according to claim 13, wherein
the transformation step is performed by the use of a list including characters which are retrievable substantially in order of decreasing, or increasing, relative frequency.

20. A method for encoding an analog signal having an amplitude with a non-uniform probability density; the method comprising:
quantizing the signal as falling within one of plural signal level ranges;
coding the quantized signal by assigning codewords to the quantizing ranges, each codeword having plural binary-valued digits having a first value or a second value,
wherein the codewords are assigned in accordance with the occurrence probability of the quantizing levels and the number of binary digits having the second value in the codeword such that quantization ranges of higher occurrence probability are assigned codewords with fewer binary digits having the second value than those assigned to quantization ranges of lower occurrence probability;
delivering a sequence of codewords as a first set of binary digits; and
encoding the first set of binary digits in the manner defined in claim 12.

21. The encoding method according to claim 20, wherein
the coding step is performed by the use of a list defining concordance between signal level ranges and codewords.

22. The encoding method according to claim 8, wherein the process of generating binary digits of the second set of binary digits includes setting the value of the m first binary digits of the second set equal to the value of the m first binary digits in the first set, where m is a positive integer.

23. The encoding method according to claim 22, wherein the process of generating a next binary digit in the second set of binary digits comprises the steps of:
generating a prediction value in response to a number of previous binary digits in the first set of binary digits,
reading the value of an actual binary digit in the first set of binary digits,
calculating the Hamming distance between the prediction value and value of the actual binary digit; and
setting the value of the binary digit in the second set of binary digits equal to the calculated Hamming distance value.

24. A method for retrieving a message from a compressed message comprising a first set of binary digits, said first set having a first number of binary digits, the method comprising the steps of:
decoding a compressed message in accordance with a predefined Huffman decoding method such that a first decoded message is achieved, the first decoded message comprising a second set of binary digits; the second set having a second number of binary digits, the second number being higher than the first number; the Huffman decoding is performed before the steps of:
retrieving a second decoded message comprising a third set of binary digits dependent on the first decoded message, the process of retrieving the second decoded message comprising the steps of:
decoding the second coded message such that the third set of binary digits is generated, each said binary digit having a first value or a second value, wherein
the binary digits in the third set of binary digits are selected such that the number of binary digits having the first binary value in third set is lower than the number of binary digits having the first binary value in the second set,
interpreting the third set of binary digits as a set of symbols, and
transforming each code symbol into a corresponding character, wherein said transformation is performed based upon a relative frequency of said each code symbol such that a third decoded message is retrieved using a list indicating correspondence between symbols and characters.

25. A data decoding method which generates a first message of binary digits in response to a second message of binary digits; each binary digit having a first value or a second value,
the process of generating the first message comprising the steps of:
receiving or reading the second message (E),
generating the first message in response to a second message such that a first set of binary digits is retrieved; and
wherein the binary digits in the first set of binary digits are selected such that the number of binary digits having the first binary value in first set is lower than the number of binary digits having the first binary value in the second set, wherein the binary digits are generated based upon a prediction value in response to a number of previous binary digits in the first set of binary digits.

26. The method according to claim 25, wherein binary digits in the first set are generated successively.

27. The method according to claim 26, wherein the process of generating successive binary digit in the first set of binary digits comprises the steps of:
reading the value of the actual binary digit in the second set of binary digits,
calculating the Hamming distance between the prediction value and value of the actual binary digit; and
setting the value of the successive binary digit in the first set of binary digits equal to the calculated Hating distance value.

28. The method according to claim 27, wherein the process of generating a prediction value comprises the steps of:
establishing a plurality of predictor count values, each predictor count value being selectable dependent on binary digits in the first set of binary digits;
initially setting all the predictor count values to zero;
f1) selecting the predictor count value;
f2) reading the selected predictor count value;
f3) setting the prediction value to a first value if the selected predictor count value is higher than a predetermined value, and setting the prediction value to a second value if the selected predictor count value is lower than the predetermined value;
f4) increasing the selected predictor count value if the value of the actual binary digit in the first set of binary digits equals one, and decreasing the selected predictor count value if the value of the actual binary digit in the first set of binary digits equals zero, and
g) repeating steps f1) to f4) until all binary digits in the first set of binary digits have been read.

29. The method according to claim 28, wherein the step of selecting the predictor count value comprises the steps of:

initially selecting a first predictor count value in response to a combination of binary digits in the first set of binary digits; and thereafter selecting successive predictor count values depending on the presently selected predictor count value and the most recently generated binary digit in the first set of binary digits.

30. The decoding method according to claim 29, further comprising dividing the first set of binary digits into a plurality of code symbols.

31. The decoding method according to claim 30 further comprising the step of:

transforming each code symbol into a corresponding binary coded character such that a decoded message is retrieved.

32. The decoding method according to claim 31, wherein the transformation comprises establishing, by use of a list including characters retrievable in a predetermined order, which character is assigned to each code symbol.

33. The decoding method according to claim 30 further comprising the step of:

generating an analogue signal in response to the plurality of code symbols.

34. The method according to claim 26, wherein the process of selecting values of the binary digits in the first set comprises setting the value of a first binary digit in the first set of binary digits equal to the value of a first binary digit in the second set of binary digits.

35. A device for encoding a message, the device comprising:

a character input for receiving said message comprising a plurality of characters;

a conversion unit for assigning a binary coded code symbol to said plurality of characters based upon a relative frequency of said characters in said message, wherein said binary coded code symbol comprises a plurality of binary digits, a first input for receiving a first set of binary digits, each said binary digit having a first value or a second value;

a first output;

a signal encoding means which is coupled to the first input and to the first output;

wherein the encoding means is set up to generate a second set of bits in response to the first set of binary digits; and wherein the encoding means is set up to select the values of the binary digits in the second set such that the number of binary digits having the first binary value in the second set is higher than the number of binary digits having the first binary value in the first set.

36. The encoding device according to claim 35, wherein the encoding means comprises:

means for generating a prediction value in response to a number of previous binary digits in the first set of binary digits, means for reading the value of the actual binary digit in the first set of binary digits, means for calculating the Hamming distance between the prediction value and value of the actual binary digit, and means for setting the value of the successive binary digit in the second set of binary digits equal to the calculated Hamming distance value.

37. The encoding device according to claim 36, further comprising:

a second input for receiving a message comprising a plurality of characters;

a second output for delivering a first coded message, a signal processing means which is coupled to the second input and to the second output, the signal processing means being devised to transform the characters such that the received message is transformed into a first coded message comprising binary coded symbols;

the signal processing means comprising means for transforming a received character into a corresponding binary coded symbol; each code symbol comprising a plurality of binary digits, and each said binary digit having a first value or a second value; and wherein the second output is coupled to the first input according to claim 35.

38. The encoding device according to claim 35, wherein the encoding means operates such that the second set includes the same number of binary digits as the first set of binary digits.

39. The encoding device according to claim 35, wherein the encoding means comprises:

means for setting the value of a first binary digit in the second set equal to the value of a first binary digit in the first set.

40. A device for decoding a message, the device comprising:

a first output for delivering a first set of binary digits, each said binary digit having a first value or a second value, a first input for receiving a second set of binary digits, a decoding means which is coupled to the input and to the output, the decoding means being set up to generate the first set of binary digits dependent on said second set of binary digits, wherein the decoding means comprises a delay unit and a predictor unit for generating prediction values; and the decoding means being set up to select the values of binary digits in the first set such that the number of binary digits having the first binary value is lower than in the encoded message.

41. The decoding device according to claim 40, wherein the first input for receiving said second set is coupled to the output of a device for retrieving a data set from a compressed data set.

42. The decoding device according to claim 41, comprising:

a second input for receiving said first set of binary digits;

means for extracting a plurality of symbols from said first set of binary digits, an output for delivering a decoded message comprising a plurality of message characters;

a decoding means which is coupled to the input and to the output, a memory which contains data indicating concordance between individual characters and symbols; and wherein the decoding means, in response to a received symbol, is devised to select a message character in accordance with the concordance indicated by the data in the memory.

43. The decoding device according to claim 42, wherein the memory data includes:

a list of characters, recorded in the memory, for providing concordance between symbols and characters.

44. The decoding device according to claim 40, wherein the decoding means operates such that the first set of binary digits includes the same number of binary digits as the second set.

45. A computer program product for use with a device for encoding information, the encoding device including a volatile memory, a processor, and a non-volatile memory having a limited recording capacity; the processor being coupled to the volatile memory and to the non-volatile memory;

the computer program product comprising:
a recording medium,
means, recorded on the recording medium, for directing the processor to receive a first set of binary digits, each said-binary digit having a first value or a second value, wherein said first set of binary digits is generated by assigning a first binary coded code symbol to a character having a highest relative frequency, said first binary coded code symbol comprising said plurality of binary digits;
means, recorded on the recording medium, for directing the processor to generate a second set of binary digits; and
means, recorded on the recording medium, for directing the processor to select the values of binary digits in the second set such that the number of binary digits having the first binary value in the second set is higher than the number of binary digits having the first binary value in the first set.

46. The computer program product according to claim 45, further comprising:
means, recorded on the recording medium, for directing the processor to generate the second set of binary digits such that it includes the same number of binary digits as the first set of binary digits.

47. The computer program product according to claim 45, further comprsing:
means, recorded on the recording medium, for directing the processor to sex the value of the m first binary digits of the second set equal to the value of the m first binary digits in the first set, where m is a positive integer,
means, recorded on the recording medium, for directing the processor to generate a prediction value in response to a number of binary digits in the first set of binary digits;
means, recorded on the recording medium, for directing the processor to read the value of an actual binary digit in the first set of binary digits;
means, recorded on the recording medium, for directing the processor to calculate the Hamming distance between the prediction value and value of the actual binary digit; and
means, recorded on the recording medium, for directing the processor to set the value of the binary digit in the second set of binary digits equal to the calculated Hamming distance value.

48. A computer program product for use with a portable text handling system for enabling retrieval of compressed data, the text handling system including a volatile memory, a processor, and a non-volatile memory having a limited recording capacity, and a display unit; the processor being coupled to the volatile memory, to the non-volatile memory, and to the display unit;

the computer program product comprising:
a recording medium,
means, recorded on the recording medium for directing the processor to read a first set of binary digits from the non-volatile memory,
means, recorded on the recording medium, for directing the processor (430), responsive to the first set of binary digits, to generate a second set of binary digits, each said binary digit having a first binary value or a second binary value, the second set having a larger number of binary digits than the first set;
means, recorded on the recording medium, for directing the processor, responsive to the second set of binary digits, to generate a third set of binary digits, such that the proportion between the number of binary digits having the first binary value and the number of binary digits having the second binary value is lower in the third set than in the second set;
means, recorded on the recording medium, for directing the processor to interpret a predefined group of binary digits in the third set as a code symbol in a first coded message,
means, recorded on the recording medium, for directing the processor to transform each code symbol of the first coded message into a corresponding character such that a decoded message is retrieved, wherein said transformation is performed based upon a relative frequency of said each code symbol; and
means, recorded on the recording medium, for directing the processor to transform a code symbol into a binary coded character such that the proportion between the number of binary digits having the first binary value and the number of binary digits having the second binary value is lower in the decoded message than in the first coded message.

49. The computer program product according to claim 48, further comprising:
means, recorded on the recording medium, for directing the processor to transmit at least some of the characters of the decoded message to the display unit.

50. A computer program product for use with a device for decoding information; the device including a volatile memory, a processor, and a non-volatile memory having a limited recording capacity; a first output for delivering a first set of binary digits, each said binary digit having a first value or a second value; a first input for receiving a second set of binary digits; the processor being coupled to the volatile memory and to the non-volatile memory;

the computer program product comprising:
a recording medium;
means, recorded on the recording medium, for directing the processor to read a second set of binary digits;
means, recorded on the recording medium, for directing the processor to generate a first set of binary digits dependent on said second set of binary digits; and
means, recorded on the recording medium, for directing the processor to select the values of binary digits in the first set such that the number of bits having the first binary value is lower than in the second set of binary digits, wherein the values of binary digits are generated based upon a prediction value in response to a number of previous binary digits in the first set.

51. The computer program product according to claim 50, further comprising:
means recorded on the recording medium, for directing the processor to generate the first set of binary digits such that the first set of binary digits includes the same number of binary digits as the second set.

* * * * *

UNITED STATES PATENT AND TRADEMARK OFFICE
CERTIFICATE OF CORRECTION

PATENT NO.    : 6,556,151 B1
DATED         : April 29, 2003
INVENTOR(S)   : Smeets et al.

It is certified that error appears in the above-identified patent and that said Letters Patent is hereby corrected as shown below:

<u>Column 6,</u>
Line 14, replace "by step S30." with -- by step S130. --
Line 35, replace "0.578" with -- 0,578 --

<u>Column 12,</u>
Line 60, replace "$y_{i+}1$." with -- "$y_{i+1}$. --

<u>Column 13,</u>
Line 20, replace "space m a non volatile" with -- space in a non volatile --
Line 59, replace "unit 260 of" with -- unit 260, of --

<u>Column 18,</u>
Line 64, replace "wherein" with -- wherein: --

<u>Column 19,</u>
Line 45, replace "includes" with -- includes: --
Line 55, replace "digits," with -- digits; --
Line 67, replace "zero," with -- zero; --

<u>Column 20,</u>
Line 5, replace "digits," with -- digits; --
Line 32, replace "message, each" with -- message; each --

<u>Column 21,</u>
Line 14, replace "value," with -- value; --
Lines 41 and 43, replace "digits," with -- digits; --
Line 65, replace "generated," with -- generated; --

UNITED STATES PATENT AND TRADEMARK OFFICE
CERTIFICATE OF CORRECTION

PATENT NO. : 6,556,151 B1
DATED : April 29, 2003
INVENTOR(S) : Smeets et al.

It is certified that error appears in the above-identified patent and that said Letters Patent is hereby corrected as shown below:

Column 22,
Line 5, replace "second set," with -- second set; --
Line 7, replace "symbols, and" with -- symbols; and --
Line 17, replace "value," with -- value; --
Line 20, replace "(E)," with -- (E); --
Line 35, replace "generating successive" with -- generating a successive --
Line 38, replace "digits," with -- digits; --
Line 42, replace "Hating" with -- Hamming --
Line 63, replace "zero," with -- zero; --

Column 23,
Line 22, replace "analogue" with -- analog --
Lines 38, 56 and 58, replace "digits," with -- digits; --
Line 60, replace "digit," with -- "digit; --

Column 24,
Line 31, replace "value," with -- value; --
Lines 32 and 52, replace "digits," with -- digits; --
Line 34, replace "output," with -- output; --

Column 25,
Line 6, replace "information," with -- information; --
Line 11, replace "medium," with -- medium; --
Line 35, replace "comprsing:" with -- comprising: --
Line 37, replace "to sex the value" with -- to set the value --
Line 39, replace "integer," with -- integer; --
Line 58, replace "data, the text" with -- data; the text --
Line 64, replace "medium," with -- medium; --

UNITED STATES PATENT AND TRADEMARK OFFICE
CERTIFICATE OF CORRECTION

PATENT NO.    : 6,556,151 B1
DATED         : April 29, 2003
INVENTOR(S)   : Smeets et al.

It is certified that error appears in the above-identified patent and that said Letters Patent is hereby corrected as shown below:

Column 26,
Line 5, replace "value, the" with -- value; the --
Line 17, replace "message," with -- message; --

Signed and Sealed this

Twenty-eighth Day of October, 2003

JAMES E. ROGAN
*Director of the United States Patent and Trademark Office*